US006546035B2

United States Patent
Imafuji et al.

(10) Patent No.: US 6,546,035 B2
(45) Date of Patent: Apr. 8, 2003

(54) SEMICONDUCTOR LASER DIODE ARRAY AND METHOD OF FABRICATING THE SAME

(75) Inventors: Osamu Imafuji, Takatsuki (JP); Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/794,085

(22) Filed: Feb. 28, 2001

(65) Prior Publication Data

US 2001/0017873 A1 Aug. 30, 2001

(30) Foreign Application Priority Data

Feb. 29, 2000 (JP) ........................................ 2000-053934

(51) Int. Cl.⁷ ............................... H01S 5/00; H01S 3/10
(52) U.S. Cl. .............................. 372/50; 372/46; 372/23; 438/22
(58) Field of Search ............................... 372/46, 50, 23; 438/22

(56) References Cited

U.S. PATENT DOCUMENTS 5,210,767 A * 5/1993 Arimoto et al. ............... 372/46
6,058,124 A * 5/2000 Sun et al. ...................... 372/46

FOREIGN PATENT DOCUMENTS

JP     11-186651     7/1999

OTHER PUBLICATIONS

K. Nemato et al., "A Laser Coupler for DVD/CD Playback by Using Monolithic Integrated 2–wavelength LDs", Draft of The 60$^{th}$ Autumn Applied Physics Lecture Meeting, 3a–ZC–10, pp. 990, Sep. 1999.

* cited by examiner

Primary Examiner—Quyen Leung
(74) Attorney, Agent, or Firm—Nixon Peabody LLP; Donald R. Studebaker

(57) ABSTRACT

A semiconductor laser diode array of this invention contains a first laser diode including a first cladding layer of a first conductivity type formed on a substrate, a first active layer formed on the first cladding layer and a second cladding layer of a second conductivity type formed on the active layer; and a second laser diode including a third cladding layer of the first conductivity type formed on the substrate with a space from the first laser diode, a second active layer formed on the third cladding layer and having a larger energy gap than the first active layer and a fourth cladding layer of the second conductivity type formed on the second active layer. The second laser diode further includes a height adjusting buffer layer of the first conductivity type formed between the substrate and the third cladding layer and having a thickness set for placing the second active layer at substantially the same height from the substrate surface as the height from the substrate surface of the first active layer.

19 Claims, 15 Drawing Sheets

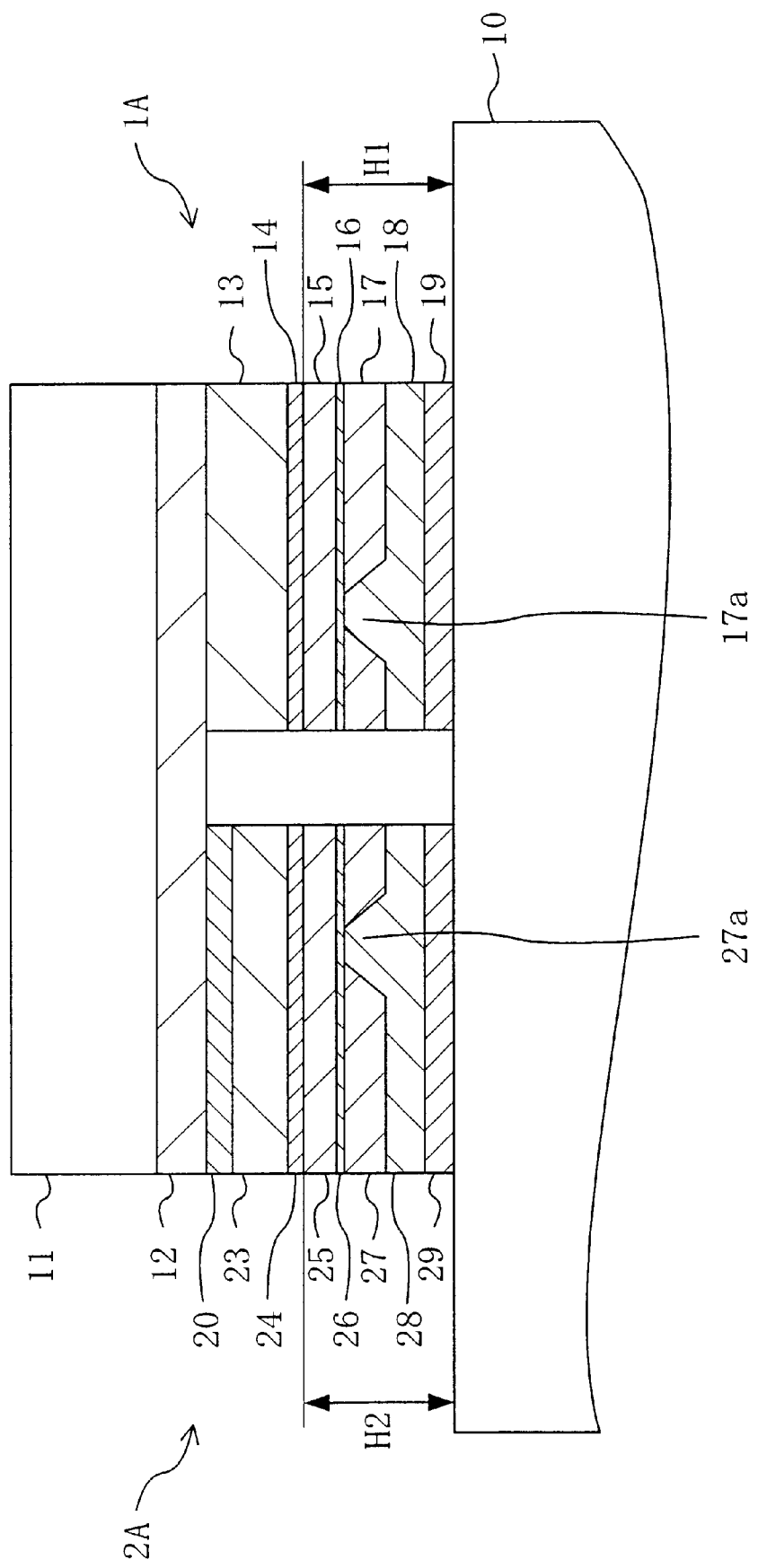

SEMICONDUCTOR LASER DIODE ARRAY AND METHOD OF FABRICATING THE SAME

BACKGROUND OF THE INVENTION

The present invention relates to a two-wavelength semiconductor laser diode array having a monolithic structure including two semiconductor laser diodes lazing at different wavelengths formed on a single substrate, and a method of fabricating the semiconductor laser diode array.

Appearance of a digital video disk (DVD) has advanced increase of the recording density of an optical disk, and an optical disk with mass storage of 8.5 GB has been realized these days. A general DVD reproducing system should reproduce data from not only a DVD but also a compact disk (CD), and is sometimes required to be capable of reproducing data from and recording data in a write-once CD (CD-R) currently rapidly spreading. As reproducing light for reproducing data from a DVD, a red laser beam of a wavelength of a 650 nm band is used, and as reproducing light for reproducing data from a CD or a CD-R, an infrared laser beam of a wavelength of a 780 nm band is used. Accordingly, a current DVD reproducing system includes two semiconductor laser chips, namely, a red semiconductor laser chip for generating the red laser beam and an infrared semiconductor laser chip for generating the infrared laser beam.

In accordance with development of compact information processing equipment such as a personal computer, it is necessary to make a DVD reproducing system more compact, and for this purpose, it is indispensable to realize a compact and thin optical pickup part. One means for realizing a compact and thin optical pickup part is simplification of an optical system. One method for simplifying an optical system is integration of a red semiconductor laser chip and an infrared semiconductor laser chip. As described above, a current DVD reproducing system includes two optical system components for the red semiconductor laser chip and the infrared semiconductor laser chip. Therefore, when the red and infrared semiconductor laser chips are integrated, the two optical system components can be shared, resulting in realizing a compact and thin optical pickup part.

As examples of the integration of a red semiconductor laser chip and an infrared semiconductor laser chip, a monolithic semiconductor laser diode array integrated on a single substrate is reported in Japanese Laid-Open Patent Publication No. 11-186651 (Conventional Example 1) and "The 60th Autumn Applied Physics Lecture Meeting", 3a-ZC-10 (Conventional Example 2).

In the semiconductor laser diode array of Conventional Example 1, each of a red laser chip and an infrared laser chip includes, as a current block (confinement) layer for efficiently injecting a current into an active layer, GaAs with an energy gap equivalent to or smaller than the energy gap (band gap) of the active layer. In this manner, a complex refractive index waveguide structure is employed, in which a laser beam emitted from the active layer is absorbed so as to effectively confine generated light within a stripe-shaped region.

In the semiconductor laser diode employing the complex refractive index waveguide structure, however, generated light is absorbed by a current block layer of GaAs, and hence, it is very difficult to attain a self-oscillation characteristic and a high-temperature high-output-power characteristic required in an optical disk unit.

Alternatively, the semiconductor laser diode array of Conventional Example 2 has the so-called gain waveguide structure including no current block layer, and hence, light is never absorbed by a current block layer. The semiconductor laser diode having the gain waveguide structure, however, does not have the complex refractive index waveguide structure for effectively confining generated light. Therefore, in order to attain low noise required in an optical disk unit, it is necessary to provide means for suppressing interference between oscillation spectra by, for example, employing multiple modes for the oscillation spectra.

Furthermore, even when the multiple modes are employed for the oscillation spectra, the half bandwidth of each spectrum is so small that emitted light and return light of the emitted light to the semiconductor laser diode can easily interfere each other. Therefore, the relative noise intensity (RIN) cannot be lowered to −130 dB/Hz or less as is desired in an optical disk unit. Accordingly, the semiconductor laser diode array having the gain waveguide structure of Conventional Example 2 needs means for lowering the RIN by using a 1/4 λ plate or the like, and hence, it is difficult to reduce the number of components included in the optical pickup part. In order to solve these problems, the semiconductor laser diode array should indispensably have a self-oscillation characteristic.

In addition, although the semiconductor laser diode array with the gain waveguide structure has a current confining function, it does not have a light confining function utilizing a refractive index distribution along a direction parallel to the principal plane of the active layer. Therefore, when it is operated at low output power of 10 mW or less in reproducing data from a DVD or a CD, a single lateral mode characteristic can be kept at room temperature, but a stable lateral mode characteristic is difficult to keep at a high temperature because carriers are so largely injected that gain can be more easily attained in a higher mode. Furthermore, since it does not have a light confining mechanism, the lateral mode characteristic is more difficult to stabilize when it is operated at high output power.

Moreover, since the optical system components are shared in the conventional monolithic two-wavelength laser diode array, the active layers of the respective laser diodes are preferably placed in the same position, namely, at the same height from the substrate surface. However, although the laser diode array is monolithic, the active layers of the respective laser diodes have different compositions, and hence, the active layers should be grown through different processes. Therefore, the heights of the active layers disadvantageously differ from each other.

SUMMARY OF THE INVENTION

An object of the invention is, for solving the aforementioned conventional problems, realizing a monolithic semiconductor laser diode array having a stable self-oscillation characteristic and definitely capable of operating at high output power and a high temperature in which a difference in the height between active layers is suppressed.

In order to achieve the object, in fabrication of a monolithic semiconductor laser diode array of this invention, a first laser diode showing laser action at a longer wavelength is formed priorly to a second laser diode showing laser action at a shorter wavelength. At this point, since a cladding layer formed closer to a substrate in the second laser diode may have a smaller thickness than a cladding layer formed closer to the substrate in the first laser diode, a buffer layer for improving the crystallinity of the second laser diode is formed and the buffer layer is provided with a height adjusting function.

Furthermore, both the first laser diode and the second laser diode are provided with a refractive index waveguide mechanism, so as to realize a stable lateral mode characteristic, and a current block layer of each laser diode is formed in a real refractive index waveguide structure, so as to realize a stable self-oscillation characteristic, a high output power operation and a high temperature operation.

Specifically, the semiconductor laser diode array of this invention comprises a first laser diode including a first cladding layer formed on a substrate from a first semiconductor of a first conductivity type, a first active layer formed on the first cladding layer from a second semiconductor and a second cladding layer formed on the first active layer from a third semiconductor of a second conductivity type; and a second laser diode including a third cladding layer formed from a fourth semiconductor of the first conductivity type on the substrate with a space from the first laser diode, a second active layer formed on the third cladding layer from a fifth semiconductor having a larger energy gap than the first active layer and a fourth cladding layer formed on the second active layer from a sixth semiconductor of the second conductivity type, and the second laser diode further includes a height adjusting buffer layer formed between the substrate and the third cladding layer from a seventh semiconductor of the first conductivity type and having a thickness set for placing the second active layer at substantially the same height from a substrate surface as a height from the substrate surface of the first active layer.

In the semiconductor laser diode array of this invention, the second laser diode including the second active layer having a larger energy gap than the first active layer of the first laser diode further includes the height adjusting buffer layer whose thickness is set for placing the second active layer at substantially the same height from the substrate surface as the first active layer. Therefore, not only the crystallinity of the semiconductor layers of the second laser diode is improved but also the height from the substrate surface of the first active layer can substantially accord with that of the second active layer. As a result, a difference in the height between light emitting parts of laser beams having difference wavelengths can be suppressed.

In the semiconductor laser diode array, it is preferred that the first laser diode includes a first current block layer formed on the second cladding layer from an eighth semiconductor having a larger energy gap than the first active layer and including a stripe-shaped opening for selectively injecting carriers into the first active layer, and that the second laser diode includes a second current block layer formed on the fourth cladding layer from a ninth semiconductor having a larger energy gap than the second active layer and including a stripe-shaped opening for selectively injecting carriers into the second active layer. In this manner, the light emitted from the first and second active layers are never absorbed by the first and second current block layers, respectively, resulting in definitely realizing a self-oscillation characteristic and a high output power characteristic at a high temperature.

In the semiconductor laser diode array, it is preferred that, in the first laser diode, a difference between an effective refractive index of a region of the first current block layer included in the opening along a vertical direction to the substrate surface and an effective refractive index of a region of the first current block layer excluding the opening along the vertical direction to the substrate surface is approximately $2 \times 10^{-3}$ through approximately $1 \times 10^{-2}$, and that, in the second laser diode, a difference between an effective refractive index of a region of the second current block layer included in the opening along the vertical direction to the substrate surface and an effective refractive index of a region of the second current block layer excluding the opening along the vertical direction to the substrate surface is approximately $2 \times 10^{-3}$ through approximately $1 \times 10^{-2}$.

In the semiconductor laser diode array, it is preferred that the first current block layer is of the first conductivity type and includes arsenic and that the second current block layer is of the first conductivity type and includes phosphorus. In this manner, the first laser diode can be an infrared laser diode that is formed from a group III–V compound semiconductor including aluminum and gallium as the group III elements and arsenic as the group V element and can emit an infrared laser beam. Also, the second laser diode can be a red laser diode that is formed from a group III–V compound semiconductor including aluminum, gallium and indium as the group III elements and phosphorus as the group V element and can emit a red laser beam.

In the semiconductor laser diode array, it is preferred that the first current block layer and the second current block layer are of the first conductivity type and include phosphorus. In this manner, even when the first laser diode is an infrared laser diode including, in the first active layer and the first and second cladding layers, compound semiconductors including gallium and arsenic and the second laser diode is a red laser diode including, in the second active layer and the third and fourth cladding layers, compound semiconductors including gallium, indium and phosphorus, layers formed on the first current block layer and the second current block layer, such as contact layers, can be formed from one compound semiconductor layer including phosphorus, and hence, the fabrication can be simplified.

In the semiconductor laser diode array, it is preferred that the first current block layer and the second current block layer are of the first conductivity type and include arsenic. In this manner, even when the first laser diode is an infrared laser diode including, in the first active layer and the first and second cladding layers, compound semiconductors including gallium and arsenic and the second laser diode is a red laser diode including, in the second active layer and the third and fourth cladding layers, compound semiconductors including gallium, indium and phosphorus, layers formed on the first current block layer and the second current block layer, such as contact layers, can be formed from one compound semiconductor layer including arsenic, and hence, the fabrication can be simplified.

The first method of fabricating a semiconductor laser diode array of this invention comprises the steps of forming a first cladding layer on a substrate from a first semiconductor of a first conductivity type; forming a first active layer on the first cladding layer from a second semiconductor; forming a second cladding layer on the first active layer from a third semiconductor of a second conductivity type; forming, on the second cladding layer, a first current block layer including a stripe-shaped opening from a fourth semiconductor minimally absorbing light emitted from the first active layer; forming a third cladding layer from a fifth semiconductor of the second conductivity type over the first current block layer including the opening; forming a first semiconductor laser diode including the first cladding layer, the first active layer, the second cladding layer, the first current block layer and the third cladding layer and forming a second laser diode formation region on the substrate by etching the first cladding layer, the first active layer, the second cladding layer, the first current block layer and the third cladding layer with an area on the third cladding layer including the opening of the first current block layer masked; forming a height adjusting buffer layer on the second laser diode formation region from a sixth semiconductor of the first conductivity type; forming a fourth cladding layer on the height adjusting buffer layer from a seventh semiconductor of the first conductivity type; forming a second active layer on the fourth cladding layer from an eighth semiconductor having a larger energy gap than the first active layer; forming a fifth cladding layer on the second active layer from a ninth semiconductor of the second conductivity type; forming, on the fifth cladding layer, a second current block layer including a stripe-shaped opening extending along substantially the same direction as a longitudinal direction of the opening of the first current block layer from a tenth semiconductor minimally absorbing light emitted from the second active layer; forming a sixth cladding layer from an eleventh semiconductor of the second conductivity type over the second current block layer including the opening; and forming a second semiconductor laser diode including the height adjusting buffer layer, the fourth cladding layer, the second active layer, the fifth cladding layer, the second current block layer and the sixth cladding layer by etching the height adjusting buffer layer, the fourth cladding layer, the second active layer, the fifth cladding layer and the second current block layer and the sixth cladding layer with an area on the sixth cladding layer including the opening of the second current block layer masked.

In the first method of fabricating a semiconductor laser diode array, in forming the second laser diode including the second active layer having a larger energy gap than the first active layer of the first semiconductor laser diode, the height adjusting buffer layer is formed on the laser diode formation region exposed on the substrate by the etching. Therefore, not only the crystallinity of the second laser diode can be improved but also the height from the substrate surface of the first active layer can substantially accord with that of the second active layer. As a result, a difference in the height between light emitting parts of laser beams having different wavelengths can be suppressed.

In the first method of fabricating a semiconductor laser diode array, a difference in a height from a substrate surface to a top surface between the third cladding layer and the sixth cladding layer is preferably approximately ±1 µm or less. In this manner, when the semiconductor laser diode array of this invention is packaged by, for example, a junction-down method, a difference in the height from the substrate to the opposite face (junction face) between the first semiconductor laser diode and the second semiconductor laser diode can be suppressed to approximately ±1 µm or less, resulting in improving the yield in packaging.

The second method of fabricating a semiconductor laser diode array of this invention comprises the steps of forming a first cladding layer on a substrate from a first semiconductor of a first conductivity type; forming a first active layer on the first cladding layer from a second semiconductor; forming a second cladding layer on the first active layer from a third semiconductor of a second conductivity type; forming a first current block layer on the second cladding layer from a fourth semiconductor minimally absorbing light emitted from the first active layer; forming one part of a first semiconductor laser diode and forming a second laser diode formation region on the substrate by etching the first cladding layer, the first active layer, the second cladding layer and the first current block layer with a first laser diode formation region on the first current block layer masked; forming a height adjusting buffer layer on the second laser diode formation region from a fifth semiconductor of the first conductivity type; forming a third cladding layer on the height adjusting buffer layer from a sixth semiconductor of the first conductivity type; forming a second active layer on the third cladding layer from a seventh semiconductor having a larger energy gap than the first active layer; forming a fourth cladding layer on the second active layer from an eighth semiconductor of the second conductivity type; forming, on the fourth cladding layer, a second current block layer including a stripe-shaped opening from the fourth semiconductor minimally absorbing light emitted from the second active layer; forming stripe-shaped openings extending at an interval in parallel to each other by etching the first current block layer and the second current block layer; forming a ninth semiconductor layer of the second conductivity type over the first current block layer and the second current block layer including the openings; and forming the other part of the first semiconductor laser diode including a fifth cladding layer and forming a second semiconductor laser diode including the height adjusting buffer layer, the third cladding layer, the second active layer, the fourth cladding layer and a sixth cladding layer by forming the fifth cladding layer on the first current block layer from the ninth semiconductor layer and forming the sixth cladding layer on the second current block layer from the ninth semiconductor layer through etching of at least the ninth semiconductor layer with the first laser diode formation region and the second laser diode formation region on the ninth semiconductor layer masked.

In the second method of fabricating a semiconductor laser diode array of this invention, in addition to the characteristics of the first method of fabricating a semiconductor laser diode array, the stripe-shaped openings can be simultaneously formed in the first current block layer and the second current block layer of the fourth semiconductor. Specifically, both the openings can be formed through one exposure process using one mask pattern having an opening pattern corresponding to the openings of the first and second current block layers extending substantially in parallel to each other. Therefore, the distance between the openings can be determined depending upon the accuracy in the lithography. Furthermore, since both the first current block layer and the second current block layer are formed from the fourth semiconductor layer, the ninth semiconductor layer can be formed on the top surface including the openings through one growth process. Therefore, the fifth cladding layer and the sixth cladding layer can be easily formed.

In the second method of fabricating a semiconductor laser diode array, a difference in a height from a substrate surface to a top surface between the fifth cladding layer and the sixth cladding layer is preferably approximately ±1 µm or less.

The third method of fabricating a semiconductor laser diode array of this invention comprises the steps of forming a first cladding layer on a substrate from a first semiconductor of a first conductivity type; forming a first active layer on the first cladding layer from a second semiconductor; forming a second cladding layer on the first active layer from a third semiconductor of a second conductivity type; forming a third cladding layer in the shape of a ridge on the second cladding layer from a fourth semiconductor of the second conductivity type; forming, on the second cladding layer on both sides of the third cladding layer, a first current block layer from a fifth semiconductor minimally absorbing light emitted from the first active layer; forming a first semiconductor laser diode including the first cladding layer, the first active layer, the second cladding layer, the third cladding layer and the first current block layer and forming a second laser diode formation region on the substrate by etching the first cladding layer, the first active layer, the second cladding layer and the first current block layer with an area on the first current block layer including the third cladding layer masked; forming a height adjusting buffer layer on the second laser diode formation region from a sixth semiconductor of the first conductivity type; forming a fourth cladding layer on the height adjusting buffer layer from a seventh semiconductor of the first conductivity type; forming a second active layer on the fourth cladding layer from an eighth semiconductor having a larger energy gap than the first active layer; forming a fifth cladding layer on the second active layer from a ninth semiconductor of the second conductivity type; forming, on the fifth cladding layer, a sixth cladding layer in the shape of a ridge extending along substantially the same direction as a longitudinal direction of the third cladding layer from a tenth semiconductor of the second conductivity type; forming, on the fifth cladding layer on both sides of the sixth cladding layer, a second current block layer from an eleventh semiconductor minimally absorbing light emitted from the second active layer; and forming a second semiconductor laser diode including the height adjusting buffer layer, the fourth cladding layer, the second active layer, the fifth cladding layer, the sixth cladding layer and the second current block layer by etching the height adjusting buffer layer, the fourth cladding layer, the second active layer, the fifth cladding layer and the second current block layer with an area on the second current block layer including the sixth cladding layer masked.

In the third method of fabricating a semiconductor laser diode array, in forming the second laser diode including the second active layer having a larger energy gap than the first active layer of the first semiconductor laser diode, the height adjusting buffer layer is formed on the laser diode formation region exposed on the substrate by etching. Therefore, not only the crystallinity of the second laser diode can be improved but also the height from the substrate surface of the first active layer can substantially accord with that of the second active layer. As a result, a difference in the height between light emitting parts of laser beams having different wavelengths can be suppressed.

The fourth method of fabricating a semiconductor laser diode array of this invention comprises the steps of forming a first cladding layer on a substrate from a first semiconductor of a first conductivity type; forming a first active layer on the first cladding layer from a second semiconductor; forming a second cladding layer on the first active layer from a third semiconductor of a second conductivity type; forming a fourth semiconductor layer of the second conductivity type on the second cladding layer; forming one part of a first semiconductor laser diode and forming a second laser diode formation region on the substrate by etching the first cladding layer, the first active layer, the second cladding layer and the fourth semiconductor layer with a first laser diode formation region on the fourth semiconductor layer masked; forming a height adjusting buffer layer on the second laser diode formation region from a fifth semiconductor of the first conductivity type; forming a third cladding layer on the height adjusting buffer layer from a sixth semiconductor of the first conductivity type; forming a second active layer on the third cladding layer from a seventh semiconductor having a larger energy gap than the first active layer; forming a fourth cladding layer on the second active layer from an eighth semiconductor of the second conductivity type; forming a ninth semiconductor layer of the second conductivity type on the fourth cladding layer; forming a fifth cladding layer from the fourth semiconductor layer and a sixth cladding layer from the ninth semiconductor layer respectively in the shape of ridges extending at an interval in parallel to each other by etching the fourth semiconductor layer and the ninth semiconductor layer; forming, on the second cladding layer on both sides of the fifth cladding layer and on the fourth cladding layer on both sides of the sixth cladding layer, a tenth semiconductor layer minimally absorbing light emitted from the first active layer and the second active layer; and forming the other part of the first semiconductor laser diode including a first current block layer and forming a second semiconductor laser diode including the height adjusting buffer layer, the third cladding layer, the second active layer, the fourth cladding layer, the sixth cladding layer and a second current block layer by forming the first current block layer on the second cladding layer from the tenth semiconductor layer and forming the second current block layer on the fourth cladding layer from the tenth semiconductor layer through etching of at least the tenth semiconductor layer with the first laser diode formation region and the second laser diode formation region on the tenth semiconductor layer masked.

In the fourth method of fabricating a semiconductor laser diode array, in addition to the characteristics of the third method of fabricating a semiconductor laser diode array, the fifth cladding layer and the sixth cladding layer can be simultaneously formed. Specifically, the fifth cladding layer and the sixth cladding layer in the shape of ridges extending at an interval in parallel to each other can be formed through one exposure process using one mask pattern having an opening pattern corresponding to these cladding layers. Therefore, a distance between these cladding layers can be determined depending upon the accuracy in the lithography. Furthermore, since the tenth semiconductor layer is formed on both sides of each of the fifth and sixth cladding layers, the first current block layer and the second current block layer can be formed from one semiconductor layer, resulting in simplifying the fabrication.

In the third or fourth method of fabricating a semiconductor laser diode array, a difference in a height from a substrate surface to a top surface between the first current block layer and the second current block layer is preferably approximately ±1 $\mu$m or less.

BRIEF DESCRIPTION OF THE DRAWINGS

FIG. 5 is a cross-sectional view of a state where the semiconductor laser diode array of Embodiment 1 is packaged;

DETAILED DESCRIPTION OF THE INVENTION

Embodiment 1

Embodiment 1 of the invention will now be described with reference to the accompanying drawings.

Figure 1:
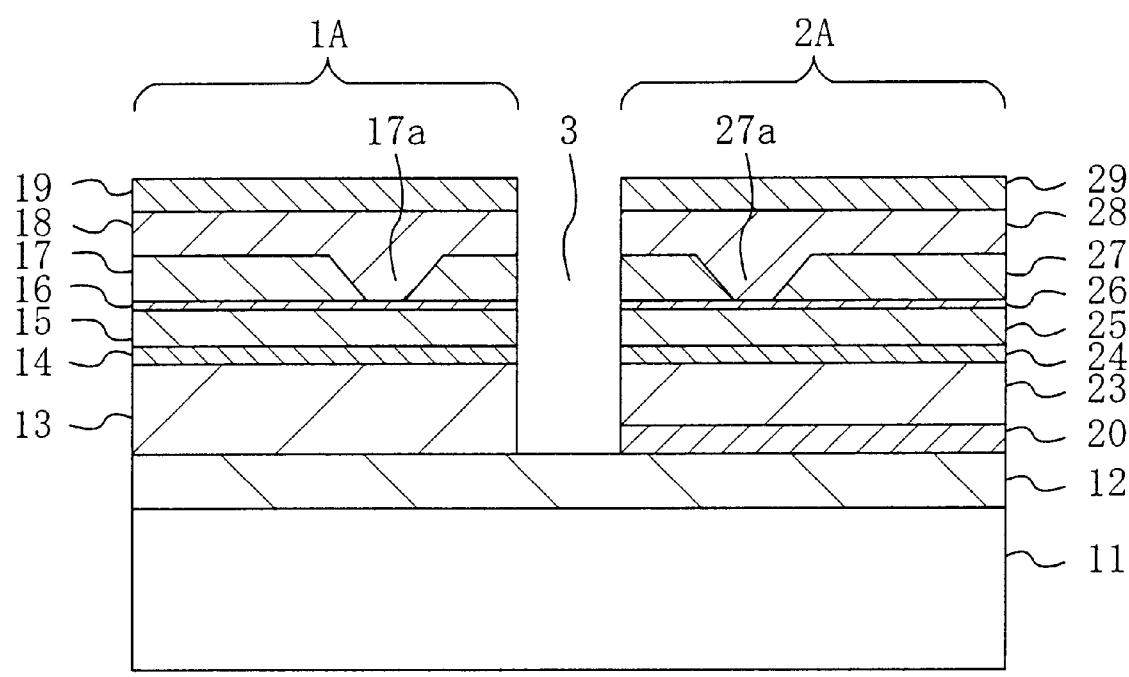
FIG. 1 is a cross-sectional view of a semiconductor laser diode array according to Embodiment 1 of the invention.

FIG. 1 shows the cross-sectional structure of a semiconductor laser diode array according to Embodiment 1. As is shown in FIG. 1, an infrared semiconductor laser diode 1A and a red semiconductor laser diode 2A separated from each other by a separation channel 3 are formed in a monolithic manner on a substrate 11 of n-type GaAs.

The infrared semiconductor laser diode 1A includes the following layers successively formed on the substrate 11: A buffer layer 12 of n-type GaAs for improving the crystallinity of semiconductor layers grown on the substrate 11; a first n-type cladding layer 13 of n-type $Al_xGa_{1-x}As$ ($0<x\leq1$) for confining carriers and recombination light of the carriers within a first active layer described below; the first active layer 14 of AlGaAs having a composition for lasing at a wavelength of 750 nm through 850 nm; a first p-type cladding layer 15 of p-type $Al_{x1}Ga_{1-x1}As$ ($0<x1\leq1$) for confining carriers and recombination light of the carriers within the first active layer 14; a second p-type cladding layer 16 of p-type $Al_{x2}Ga^{1-x2}As$ ($0<x2<1$) working as an etching stopper in forming an opening in a first current block layer described below; the first current block layer 17 of n-type $Al_{y1}Ga_{1-y1}As$ ($0<y1<1$) having an energy gap (band gap) larger than the energy of light emitted from the first active layer 14 and including an opening 17a (which extends in a vertical direction to the face of FIG. 1) for forming a stripe-shaped current channel in the first active layer 14; a third p-type cladding layer 18 of p-type $Al_{x3}Ga_{1-x3}As$ ($0<x3<1$) formed to fill the opening 17a; and a first p-type contact layer 19 of p-type GaAs in ohmic contact with a first p-side electrode (not shown) formed thereon.

The red semiconductor laser diode 2A includes the following layers successively formed on the buffer layer 12 and separated from the infrared semiconductor laser diode 1A by the separation channel 3: A height adjusting buffer layer 20 of n-type GaAs for improving the crystallinity of semiconductor layers grown on the substrate 11 having a thickness adjusted for placing a second active layer described below at the same height from the substrate surface as the first active layer 14; a second n-type cladding layer 23 of n-type $(Al_zGa_{1-z})_{0.5}In_{0.5}P$ ($0<z\leq1$) for confining carriers and recombination light of the carriers within a second active layer described below; the second active layer 24 having a multiple quantum well structure of AlGaInP having a composition for lasing at a wavelength of 635 nm through 680 nm; a fourth p-type cladding layer 25 of p-type $(Al_{x4}Ga_{1-x4})_{0.5}In_{0.5}P$ ($0<x4\leq1$) for confining carriers and recombination light of the carriers within the second active layer 24; a fifth p-type cladding layer 26 of p-type $(Al_{x5}Ga_{1-x5})_{0.5}In_{0.5}P$ ($0\leq x5\leq1$) working as an etching stopper in forming an opening in a second current block layer described below; the second current block layer 27 of n-type $(Al_{y2}Ga_{1-y2})_{0.5}In_{0.5}P$ ($0\leq y2\leq1$) having an energy gap larger than the energy of light emitted from the second active layer 24 and including an opening 27a extending substantially in parallel to the opening 17a of the first current block layer 17 for forming a stripe-shaped current channel in the second active layer 24; a sixth p-type cladding layer 28 of p-type $(Al_{x6}Ga_{1-x6})_{0.5}In_{0.5}P$ ($0<x6\leq1$) formed to fill the opening 27a; and a second p-type contact layer 29 of p-type GaAs in ohmic contact with a second p-side electrode (not shown) formed thereon.

Although the top face of the buffer layer 12 is exposed in the separation channel 3 in FIG. 1, the top face of the substrate 11 may be exposed instead. Furthermore, the height adjusting buffer layer 20 of the red semiconductor laser diode 2A may also work as the buffer layer 12.

The infrared semiconductor laser diode 1A of Embodiment 1 is a refractive index waveguide type laser diode in which structure parameters such as thicknesses and composition ratios of Al of the respective semiconductor layers are set so that a difference $\Delta n$ between an effective refractive index n1, along a vertical direction to the substrate surface, of a region of the first current block layer 17 included in the opening 17a and an effective refractive index n2, along the vertical direction to the substrate surface, of a region of the first current block layer 17 excluding the opening 17a can be approximately $2\times10^{-3}$ through approximately $1\times10^{-2}$.

Similarly, the red semiconductor laser diode 2A of Embodiment 1 is a refractive index waveguide type laser diode in which structure parameters such as thicknesses and composition ratios of Al of the respective semiconductor layers are set so that a different $\Delta n$ between an effective refractive index n1, along the vertical direction to the substrate surface, of a region of the second current block layer 27 included in the opening 27a and an effective refractive index n2, along the vertical direction to the substrate surface, of a region of the second current block layer 27 excluding the opening 27a can be approximately $2\times10^{-3}$ through approximately $1\times10^{-2}$.

Now, exemplified structure parameters for allowing the infrared semiconductor laser diode 1A and the red semiconductor laser diode 2A to have a self-oscillation characteristic required for reducing noise will be described with reference to the accompanying drawing.

Figure 2:
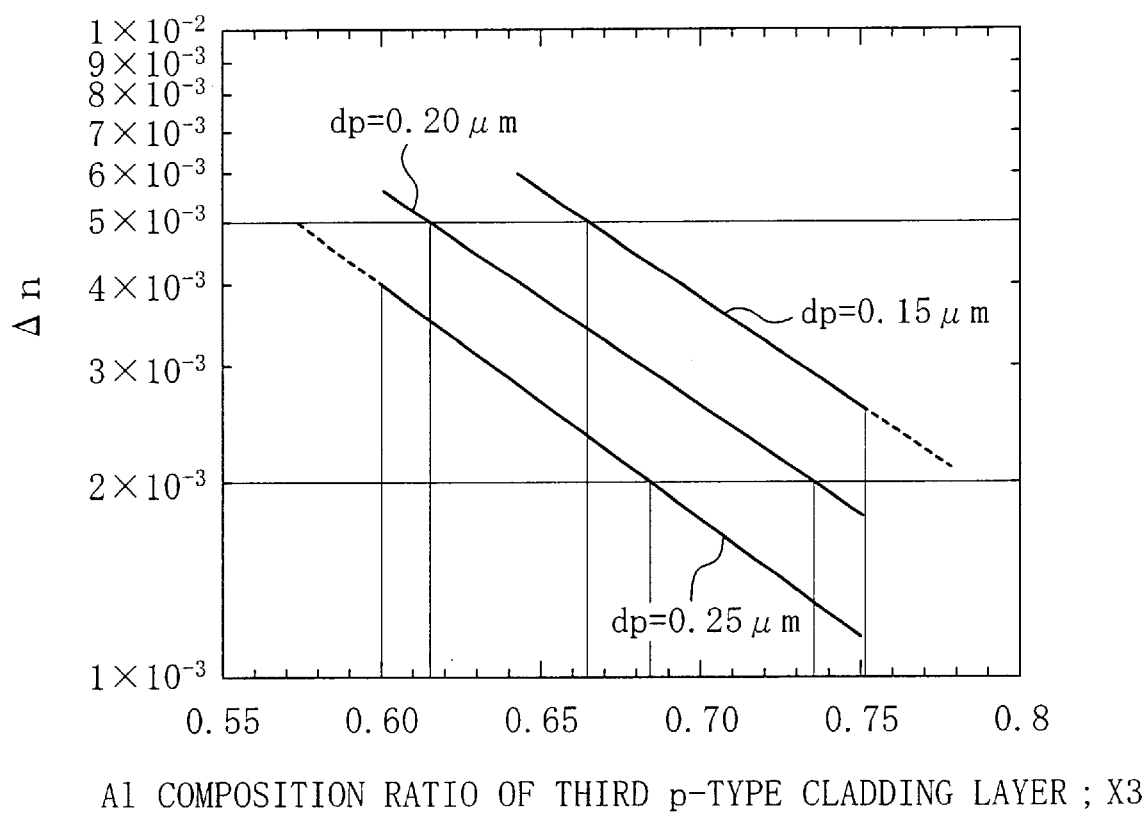
FIG. 2 is a graph for showing the relationship between the thickness of a first p-type cladding layer and an Al composition ratio of a third p-type cladding layer of an infrared semiconductor laser diode, and a difference in the effective refractive index in the semiconductor laser diode array of Embodiment 1.

FIG. 2 shows the relationship, obtained through calculation, between the thickness of the first p-type cladding layer 15 and the Al composition ratio x3 of the third p-type cladding layer 18, and the difference $\Delta n$ in the effective refractive index in the infrared semiconductor laser diode 1A of Embodiment 1. In FIG. 2, other structure parameters are set as follows: In the first n-type cladding layer 13, the thickness is approximately 1.5 μm and the Al composition ratio x is 0.5; in the first active layer 14, the thickness is approximately 0.06 μm; in the first p-type cladding layer 15, the Al composition ratio x1 is 0.5; in the second p-type cladding layer 16, the thickness is approximately 0.01 μm and the Al composition ratio x2 is 0.2; in the first current block layer 17, the thickness is approximately 1 μm and the Al composition ratio y1 is 0.65; and in the third p-type cladding layer 18, the thickness is approximately 2.2 μm.

As is understood from FIG. 2, as the thickness dp of the first p-type cladding layer 15 is smaller and as the Al composition ratio x3 of the third p-type cladding layer 18 is smaller, the difference Δn in the effective refractive index is larger. In order to obtain a stable self-oscillation characteristic, the difference Δn in the effective refractive index should be $2 \times 10^{-3}$ through $5 \times 10^{-3}$. On the basis of the relationship shown in FIG. 2, it is understood that, for example, when the thickness dp of the first p-type cladding layer 15 is set to 0.20 μm, the Al composition ratio x3 of the third p-type cladding layer 18 should be set to approximately 0.61 through 0.74.

The combination of the structure parameters for attaining the difference Δn in the effective refractive index of $2 \times 10^{-3}$ through $5 \times 10^{-3}$ shown in FIG. 2 is described merely as an example, and it goes without saying that an appropriate combination is varied when the other structure parameters (such as the Al composition ratios and the thicknesses of the respective semiconductor layers) are changed.

Similarly in the red semiconductor laser diode 2A, a self-oscillation characteristic can be realized by appropriately selecting the structure parameters for attaining the difference Δn in the effective refractive index of $2 \times 10^{-3}$ through $5 \times 10^{-3}$. For example, the Al composition ratio z of the second n-type cladding layer 23 is set to 0.7 and the wavelength for showing lasing action of the second active layer 24 is set to 635 nm through 680 nm. The Al composition ratio x4 of the fourth p-type cladding layer 25 is set to 0.7 and the thickness thereof is set to approximately 0.1 μm through 0.3 μm. The Al composition ratio x5 of the fifth p-type cladding layer 26 is set to 0.0 through 0.1 and the thickness thereof is set to approximately 0.009 μm. The Al composition ratio y2 of the second current block layer 27 is set to 0.5 and the Al composition ratio x6 of the sixth p-type cladding layer 28 is set to 0.6 through 0.75. In this manner, the difference Δn in the effective refractive index of $2 \times 10^{-3}$ through $5 \times 10^{-3}$ can be realized in the red semiconductor laser diode 2A.

Furthermore, the red semiconductor laser diode 2A of Embodiment 1 is characterized by including the height adjusting buffer layer 20 provided between the buffer layer 12 and the second n-type cladding layer 23 not only for improving the crystallinity of the semiconductor layers of the red semiconductor laser diode 2A but also for adjusting the height from the substrate surface of the second active layer 24 so as to accord with the height of the first active layer 14 of the infrared semiconductor laser diode 1A.

For example, in the case where the infrared semiconductor laser diode 1A and the red semiconductor laser diode 2A are operated at comparatively high output power, the thickness of the first n-type cladding layer 13 should be 2.0 μm or more but the thickness of the second n-type cladding layer 23 may be 1.5 μm or more. Accordingly, the thickness of the height adjusting buffer layer 20 is set to approximately 0.5 μm in this case.

Alternatively, in the case where the laser diodes are operated at comparatively low output power, the thickness of the first n-type cladding layer 13 should be 1.5 μm or more and the thickness of the second n-type cladding layer 23 should be 1.1 μm or more. Accordingly, the thickness of the height adjusting buffer layer 20 is set to approximately 0.4 μm in this case.

As described so far, a self-oscillation type semiconductor laser diode array can be realized, and in addition, the semiconductor laser diodes can be operated at high output power according to Embodiment 1. Furthermore, one laser diode lasing at a shorter wavelength in the two-wavelength laser diode array, namely, the red semiconductor laser diode 2A, is provided with the height adjusting buffer layer 20 for suppressing a difference in the height from the substrate surface between the first active layer 14 and the second active layer 24. Accordingly, in integrating the semiconductor laser diode array of this embodiment into an optical disk unit, adjustment such as positioning against an optical system component can be eased.

Furthermore, in the case where a laser beam with high output power necessary for a writable optical disk is required, the lateral mode can be more stabilized by setting the difference Δn in the effective refractive index to $4 \therefore 10^{-3}$ through $1 \times 10^{-2}$. Thus, a semiconductor laser diode array with high output power can be realized.

Now, a method of fabricating the semiconductor laser diode array of Embodiment 1 will be described with reference to the accompanying drawings.

Figure 3A:
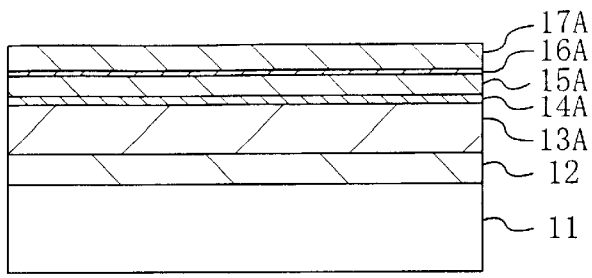
FIGS. 3A, 3B, 3C and 3D are cross-sectional views for showing procedures in a method of fabricating the semiconductor laser diode array of Embodiment 1.

FIGS. 3A through 3D and 4A through 4C are cross-sectional views for showing procedures in the method of fabricating the semiconductor laser diode array of Embodiment 1. First, as is shown in FIG. 3A, the following layers are successively grown on a substrate 11 of n-type GaAs by, for example, metal organic vapor phase epitaxial growth (MOVPE): A buffer layer 12 of n-type GaAs; a first n-type cladding formation layer 13A of n-type $Al_{0.5}Ga_{0.5}As$ with a thickness of approximately 1.5 μm; a first active formation layer 14A with a thickness of approximately 0.06 μm of AlGaAs having a composition for lasing at a wavelength of 750 nm through 850 nm; a first p-type cladding formation layer 15A of p-type $Al_{0.5}Ga_{0.5}As$ with a thickness of approximately 0.25 μm; a second p-type cladding formation layer 16A of p-type $Al_{0.2}Ga_{0.8}As$ with a thickness of approximately 0.01 μm; and a first current block formation layer 17A of n-type $Al_{0.65}Ga_{0.35}As$ with a thickness of approximately 1 μm.

Figure 3B:
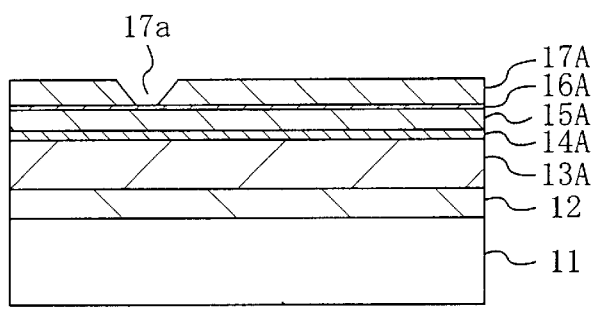

Next, as is shown in FIG. 3B, the first current block formation layer 17A is selectively chemically etched by using the second p-type cladding formation layer 16A as an etching stopper, thereby forming a stripe-shaped opening 17a.

Figure 3C:
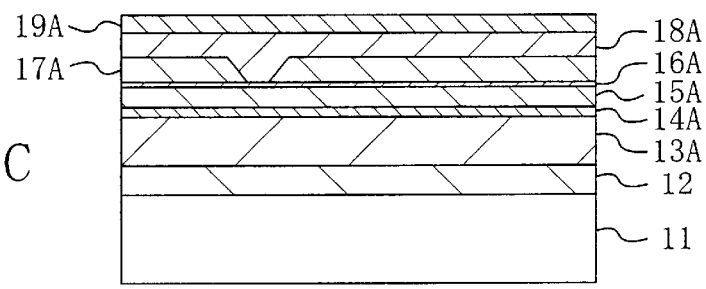

Then, as is shown in FIG. 3C, a third p-type cladding formation layer 18A of p-type $Al_{0.6}Ga_{0.4}As$ with a thickness of approximately 2.2 μm is grown on the first current block formation layer 17A so as to fill the opening 17a, and a first p-type contact formation layer 19A of p-type GaAs in a high concentration is subsequently grown on the third p-type cladding formation layer 18A by the MOVPE again.

Figure 3D:
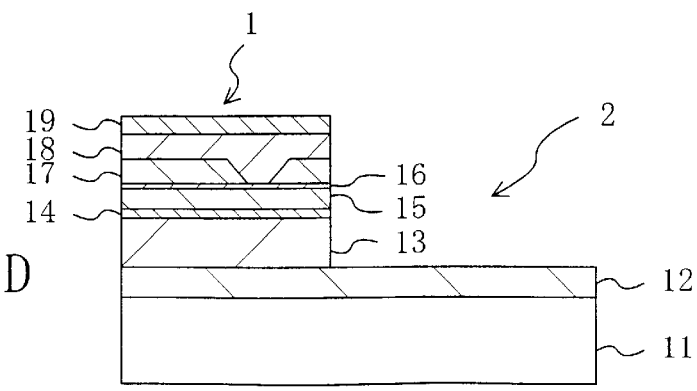

Next, as is shown in FIG. 3D, with an infrared laser diode formation region 1 on the first p-type contact formation layer 19A including the opening 17a of the first current block formation layer 17A masked, the first n-type cladding formation layer 13A, the first active formation layer 14A, the first p-type cladding formation layer 15A, the second p-type cladding formation layer 16A, the first current block formation layer 17A, the third p-type cladding formation layer 18A and the first p-type contact formation layer 19A are chemically etched. Thus, a red laser diode formation region 2 where the buffer layer 12 is exposed is formed on the substrate 11. In this manner, in the infrared laser diode formation region 1, a first n-type cladding layer 13 is formed from the first n-type cladding formation layer 13A, a first active layer 14 is formed from the first active formation layer 14A, a first p-type cladding layer 15 is formed from the first p-type cladding formation layer 15A, a second p-type cladding layer 16 is formed from the second p-type cladding formation layer 16A, a first current block layer 17 is formed from the first current block formation layer 17A, a third p-type cladding layer 18 is formed from the third p-type cladding formation layer 18A, and a first p-type contact layer 19 is formed from the first p-type contact formation layer 19A. At this point, the etching for forming the red laser diode formation region 2 may be carried out so as to expose the surface of the substrate 11.

Figure 4A:
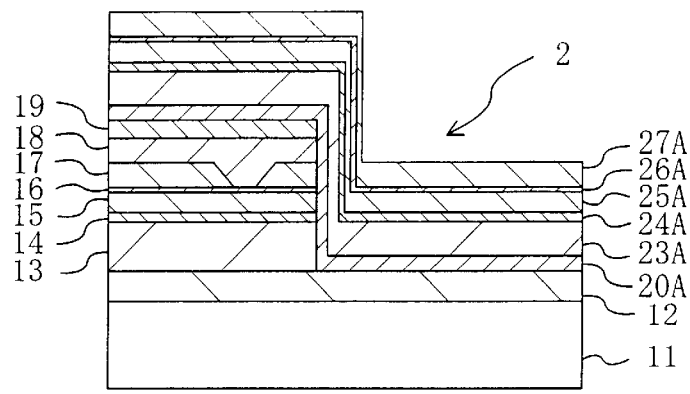
FIGS. 4A, 4B and 4C are cross-sectional views for showing other procedures in the method of fabricating the semiconductor laser diode array of Embodiment 1.

Subsequently, as is shown in FIG. 4A, a height adjusting buffer formation layer 20A of n-type GaAs with a thickness of approximately 0.4 μm is grown on the entire surface of the substrate 11 including the red laser diode formation region 2 by the MOVPE. Thereafter, the following layers are successively grown on the height adjusting buffer formation layer 20A: A second n-type cladding formation layer 23A of n-type $(Al_{0.7}Ga_{0.3})_{0.5}In_{0.5}P$ with a thickness of approximately 1.1 μm; a second active formation layer 24A having a MQW structure of AlGaInP with a composition for lasing at a wavelength of 630 nm through 680 nm; a fourth p-type cladding formation layer 25A of p-type $(Al_{0.7}Ga_{0.3})_{0.5}In_{0.5}P$ with a thickness of approximately 0.25 μm; a fifth p-type cladding formation layer 26A of p-type $(Al_{0.1}Ga_{0.9})_{0.5}In_{0.5}P$ with a thickness of approximately 0.009 μm; and a second current block formation layer 27A of n-type $(Al_{0.5}Ga_{0.5})_{0.5}In_{0.5}P$ with a thickness of approximately 1 μm.

Figure 4B:
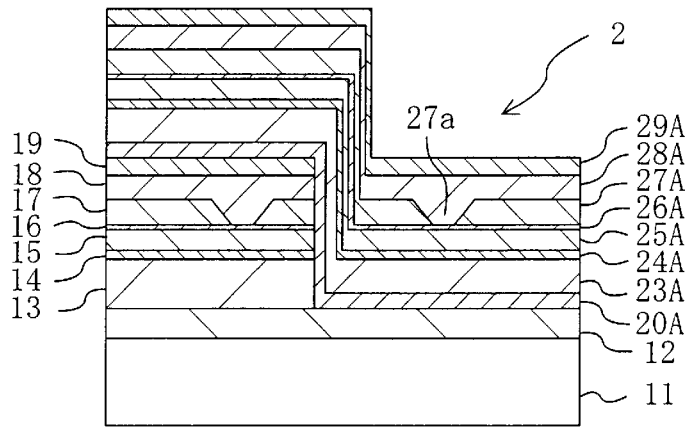

Next, as is shown in FIG. 4B, the second current block formation layer 27A in the red laser diode formation region 2 is selectively chemically etched by using the fifth p-type cladding formation layer 26A as an etching stopper, thereby forming a stripe-shaped opening 27a extending substantially in parallel to the opening 17a of the first current block layer 17. Subsequently, a sixth p-type cladding formation layer 28A of p-type $(Al_{0.6}Ga_{0.4})_{0.5}In_{0.5}P$ with a thickness of approximately 2.2 μm is grown on the entire surface of the second current block formation layer 27A so as to fill the opening 27a, and a second p-type contact formation layer 29A of p-type GaAs in a high concentration is subsequently grown on the sixth p-type cladding formation layer 28A by the MOVPE.

Figure 4C:
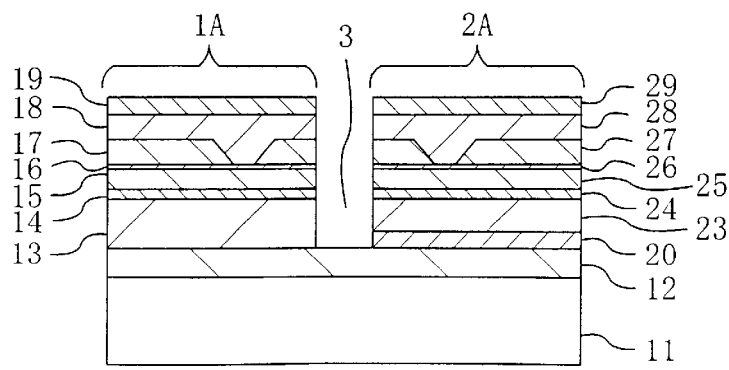

Then, as is shown in FIG. 4C, with the infrared laser diode formation region 1 and the red laser diode formation region 2 masked, the height adjusting buffer formation layer 20A, the second n-type cladding formation layer 23A, the second active formation layer 24A, the fourth p-type cladding formation layer 25A, the fifth p-type cladding formation layer 26A, the second current block formation layer 27A, the sixth p-type cladding formation layer 28A and the second p-type contact formation layer 29A are chemically etched so as to expose the buffer layer 12 or the substrate 11, thereby forming a separation channel 3. In this manner, a red semiconductor laser diode 2A is formed in the red laser diode formation region 2. Accordingly, the red semiconductor laser diode 2A includes a height adjusting buffer layer 20 formed from the height adjusting buffer formation layer 20A; a second n-type cladding layer 23 formed from the second n-type cladding formation layer 23A; a second active layer 24 formed from the second active formation layer 24A; a fourth p-type cladding layer 25 formed from the fourth p-type cladding formation layer 25A; a fifth p-type cladding layer 26 formed from the fifth p-type cladding formation layer 26A; a second current block layer 27 formed from the second current block formation layer 27A; a sixth p-type cladding layer 28 formed from the sixth p-type cladding formation layer 28A; and a second p-type contact layer 29 formed from the second p-type contact formation layer 29A.

A distance between luminescent points of the infrared semiconductor laser diode 1A and the red semiconductor laser diode 2A, namely, a distance between the opening 17a of the first current block layer 17 and the opening 27a of the second current block layer 27 for defining the distance between the luminescent points, is preferably approximately 80 μm through 300 μm. In use of the semiconductor laser diode array of Embodiment 1, two laser beams emitted from the semiconductor laser diode array are used by a single optical system component, so as to conduct signal processing of an RF signal, a tracking signal, an error signal and a focus error signal by using light receiving devices respectively corresponding to the two laser beams. Therefore, an infrared light receiving device and a red light receiving device are necessary for the infrared semiconductor laser diode and the red semiconductor laser diode, respectively. Accordingly, the arrangement of the light receiving devices is determined on the basis of the distance between the luminescent points of the semiconductor laser diodes. When the distance between the luminescent points is too small, it is difficult to independently dispose the infrared light receiving device and the red light receiving device. On the contrary, when the distance between the luminescent points is too large, the two laser beams emitted from the semiconductor laser diode array cannot be used by a single optical system component.

FIG. 5 shows the semiconductor laser diode array of this embodiment in a packaged state. In FIG. 5, like reference numerals are used to refer to like elements used in the laser diode array shown in FIG. 1. As is shown in FIG. 5, the semiconductor laser diode array of FIG. 1 is packaged by a junction-down method on a principal plane of a sub-mount 10 made from a material good at a conducting property and a heat-radiating property, such as silicon (Si) and silicon carbide (SiC). At this point, it is preferred, in the infrared semiconductor laser diode 1A and the red semiconductor laser diode 2A, that heights H1 and H2 from the principal plane of the sub-mount 10 to the first active layer 14 and the second active layer 24, respectively accord with each other.

In general, a light receiving face of each of the infrared light receiving device and the red light receiving device is divided into plural receiving regions, and a receiving position of a laser beam entering each receiving region is required of high accuracy. Since signal processing of optical signals is carried out through an operation of optical signals entering the divided receiving regions, desired signal processing cannot be carried out unless a laser beam enters a predetermined position of each receiving region. Accordingly, accuracy in the positions of the luminescent points of the infrared semiconductor laser diode 1A and the red semiconductor laser diode 2A is extremely significant in conducting the signal processing.

The accuracy in the position of the luminescent points along an in-plane direction (X-Y direction) on the principal plane of the sub-mount 10 in FIG. 5 is determined depending upon the accuracy in positions of the opening 17a of the infrared semiconductor laser diode 1A and the opening 27a of the red semiconductor laser diode 2A, which exactly corresponds to lithography accuracy in the photolithography. In this case, accuracy of ±2 μm can be easily attained by using an alignment key or the like.

On the other hand, the accuracy in the position along a vertical direction (z direction) to the principal plane of the sub-mount 10 is determined depending upon the total thickness of the layers from the first active layer 14 to the first p-type contact layer 19 in the infrared semiconductor laser diode 1A, and upon the total thickness of the layers from the second active layer 24 to the second p-type contact layer 29 in the red semiconductor laser diode 2A.

As described above, however, the structure parameters of the infrared semiconductor laser diode 1A and the red semiconductor laser diode 2A are changed in accordance with the type of the laser diode array, namely, the self-oscillation type or the high output power type, and hence, the thicknesses of the respective cladding layers and active layers cannot be uniquely determined. Accordingly, in a region from the active layers toward the substrate 11, it is significant to keep the accuracy in the positions of the luminescent points along the Z direction by adjusting the thicknesses of the buffer layer 12 and the height adjusting buffer layer 20. On the other hand, in a region from the first and second active layers 14 and 24 away from the substrate 11, it is significant to keep the accuracy in the positions of the luminescent points along the Z direction by adjusting the thicknesses of the first p-type contact layer 19 and the second p-type contact layer 29.

In Embodiment 1, in the case where, for example, the thickness of the second current block layer 27 of the red semiconductor laser diode 2A is changed in a range between 0.3 μm and 1.0 μm, the positions of the luminescent points of the two semiconductor laser diodes 1A and 2A can be highly accurately determined by adjusting the thickness of the second p-type contact layer 29 of the red semiconductor laser diode 2A in a range between 2.851 μm and 3.551 μm.

Furthermore, since the crystals of the respective semiconductor layers are grown by the MOVPE, the thickness of each layer can be controlled on the order of an atomic layer, and hence, the accuracy in the positions of the luminescent points can be definitely improved. Alternatively, the crystals may be grown by electron beam epitaxial growth (MBE) that can more accurately control the thickness.

In Embodiment 1, since the infrared semiconductor laser diode 1A is formed priorly to the red semiconductor laser diode 2A, the following particular effect can be exhibited: Since the red semiconductor laser diode 2A is generally formed from semiconductors including AlGaInP, zinc (Zn) corresponding to a p-type dopant is diffused from a p-type semiconductor layer into another layer through a high temperature process conducted at 600° C. or more. Therefore, if the red semiconductor laser diode 2A is formed priorly to the infrared semiconductor laser diode 1A, the red semiconductor laser diode 2A is subjected to two high temperature processes conducted at 600° C. or more during the formation of the infrared semiconductor laser diode 1A. As a result, zinc is conspicuously diffused from the p-type cladding layer 25 and the like to the second active layer 24 in the red semiconductor laser diode 2A, so as to degrade the light emitting characteristic of the second active layer 24. Accordingly, it is preferred, for securing the performance and the reliability of the semiconductor laser diode array, that the infrared semiconductor laser diode 1A formed from semiconductors including AlGaAs is priorly formed as in Embodiment 1.

Modification of Embodiment 1

A modification of Embodiment 1 will now be described with reference to the accompanying drawings.

Figure 6:
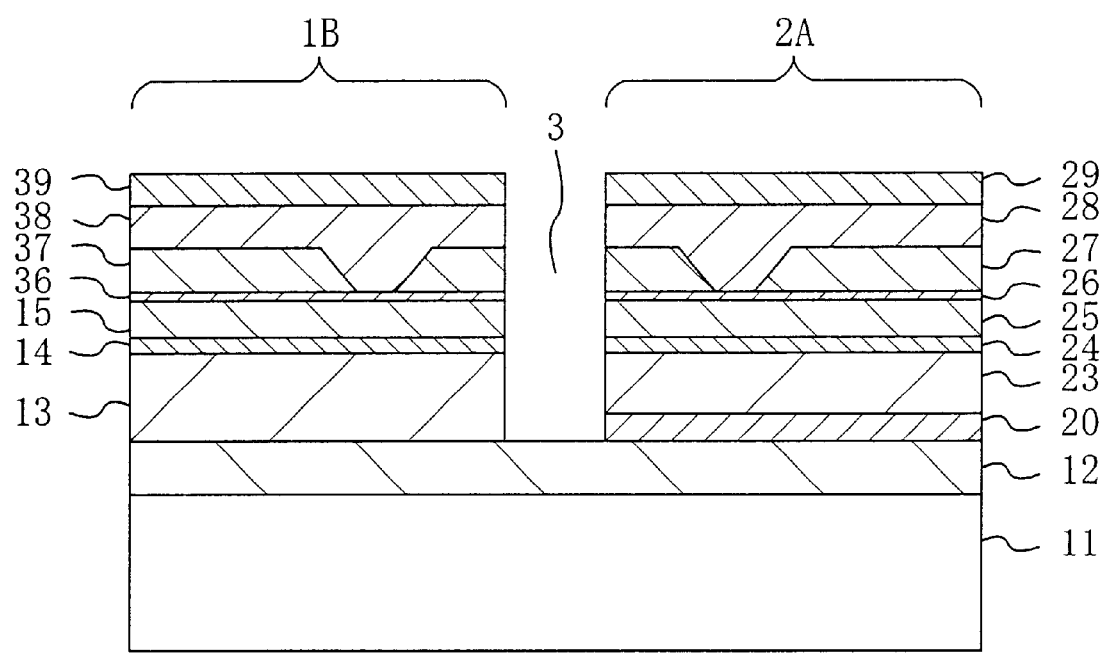
FIG. 6 is a cross-sectional view of a semiconductor laser diode array according to a modification of Embodiment 1.

FIG. 6 shows the cross-sectional structure of a semiconductor laser diode array according to one modification of Embodiment 1. In FIG. 6, like reference numerals are used to refer to like elements shown in FIG. 1, so as to omit the description. As is shown in FIG. 6, an infrared semiconductor laser diode 1B and a red semiconductor laser diode 2A separated from each other by a separation channel 3 are formed in a monolithic manner on a substrate 11 of n-type GaAs.

The infrared semiconductor laser diode 1B of this modification is different from the infrared semiconductor laser diode 1A of Embodiment 1 in a second p-type cladding layer 36 formed from p-type $(Al_{x5}Ga_{1-x5})_{0.5}In_{0.5}P$, a first current block layer 37 formed from n-type $(Al_{y2}Ga_{1-y2})_{0.5}In_{1.5}P$, a third p-type cladding layer 38 formed from p-type $(Al_{x6}Ga_{1-x6})_{0.5}In_{0.5}P$, and a first p-type contact layer 39 formed from p-type GaAs. In other words, the second p-type cladding layer 36, the first current block layer 37, the third p-type cladding layer 38 and the first p-type contact layer 39 respectively have the same compositions as corresponding layers of the red semiconductor laser diode 2A, namely, a fifth cladding layer 26, a second current block layer 27, a sixth p-type cladding layer 28 and a second p-type contact layer 29.

When this structure is employed, the third p-type cladding layer 38 and the sixth p-type cladding layer 28 can be formed in one growth process and the first p-type contact layer 39 and the second p-type contact layer 29 can be formed in one growth process. As a result, the fabrication process can be simplified.

A method of fabricating the semiconductor laser diode array of this modification will now be described with reference to the accompanying drawings.

FIGS. 7A through 7C and 8A through 8C are cross-sectional views for showing procedures in the method of fabricating the semiconductor laser diode array of the modification of Embodiment 1.

Figure 7A:
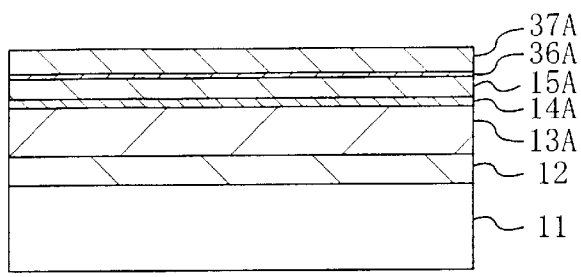
FIGS. 7A, 7B and 7C are cross-sectional views for showing procedures in a method of fabricating the semiconductor laser diode array of the modification of Embodiment 1.

First, as is shown in FIG. 7A, the following layers are successively grown on a substrate 11 of n-type GaAs by, for example, the metal organic vapor phase epitaxial growth (MOVPE): A buffer layer 12 of n-type GaAs; a first n-type cladding formation layer 13A of n-type $Al_{0.5}Ga_{0.5}As$ with a thickness of approximately 1.5 μm; a first active formation layer 14A of AlGaAs with a composition for lasing at a wavelength of 750 nm through 850 nm with a thickness of approximately 0.06 μm; a first p-type cladding formation layer 15A of p-type $Al_{0.5}Ga_{0.5}As$ with a thickness of approximately 0.25 μm; a second p-type cladding formation layer 36A of p-type $(Al_{0.5}Ga_{0.5})_{0.5}In_{0.5}P$ with a thickness of approximately 0.01 μm; and a first current block formation layer 37A of n-type $(Al_{0.5}Ga_{0.5})_{0.5}In_{0.5}P$ with a thickness of approximately 1 μm.

Figure 7B:
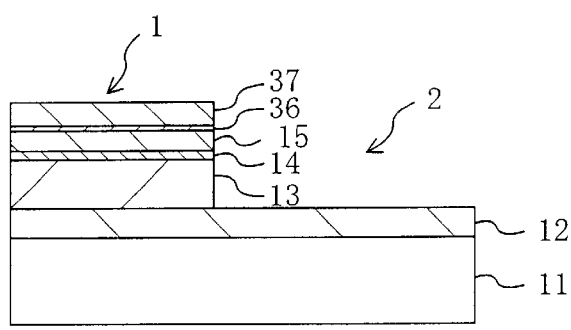

Next, as is shown in FIG. 7B, with an infrared laser diode formation region 1 on the first current block formation layer 37A masked, the first n-type cladding formation layer 13A, the first active formation layer 14A, the first p-type cladding formation layer 15A, the second p-type cladding formation layer 36A and the first current block formation layer 37A are chemically etched. Thus, a red laser diode formation region 2 where the buffer layer 12 is exposed is formed on the substrate 11. In this manner, in the infrared semiconductor laser diode formation region 1, a first n-type cladding layer 13 is formed from the first n-type cladding formation layer 13A, a first active layer 14 is formed from the first active formation layer 14A, a first p-type cladding layer 15 is formed from the first p-type cladding formation layer 15A, a second p-type cladding layer 36 is formed from the second p-type cladding formation layer 36A, and a first current block layer 37 is formed from the first current block formation layer 37A. At this point, the etching for forming the red laser diode formation region 2 may be carried out so as to expose the surface of the substrate 11.

Figure 7C:
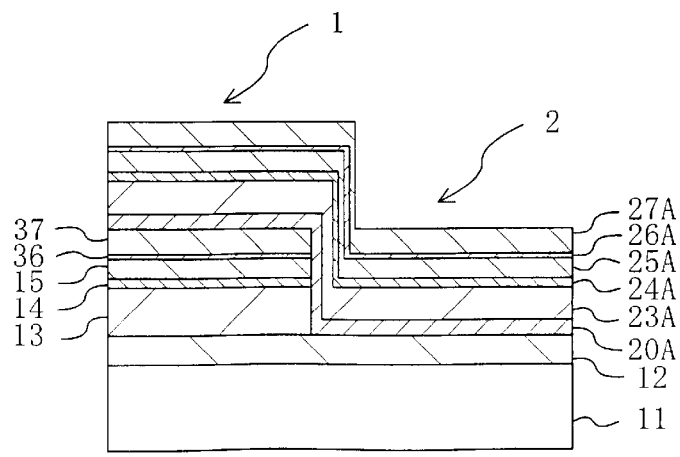

Then, as is shown in FIG. 7C, a height adjusting buffer formation layer 20A of n-type GaAs with a thickness of approximately 0.4 μm is grown on the entire surface of the substrate 11 including the red laser diode formation region 2 by the MOVPE. Thereafter, the following layers are successively grown on the height adjusting buffer formation layer 20A: A second n-type cladding formation layer 23A of n-type $(Al_{0.7}Ga_{0.3})_{0.5}In_{0.5}P$ with a thickness of approximately 1.1 μm; a second active formation layer 24A having a MQW structure of AlGaInP with a composition for lasing at a wavelength of 635 nm through 680 nm; a fourth p-type cladding formation layer 25A of p-type $(Al_{0.7}Ga_{0.3})_{0.5}In_{0.5}P$ with a thickness of approximately 0.25 μm; a fifth p-type cladding formation layer 26A of p-type $(Al_{0.1}Ga_{0.9})_{0.5}In_{0.5}P$ with a thickness of approximately 0.009 μm; and a second current block formation layer 27A of n-type $(Al_{0.5}Ga_{0.5})_{0.5}In_{0.5}P$ with a thickness of approximately 1 μm.

Figure 8A:
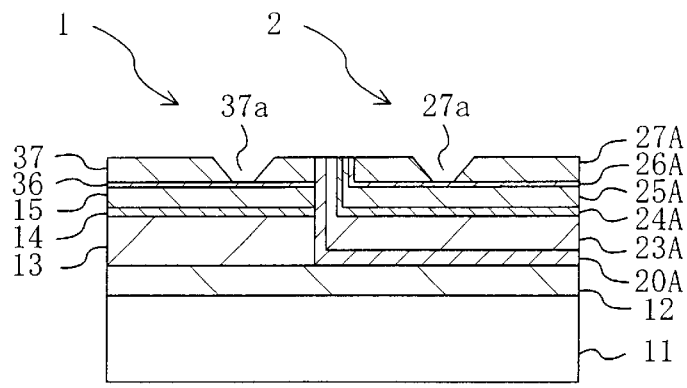
FIGS. 8A, 8B and 8C are cross-sectional views for showing other procedures in the method of fabricating the semiconductor laser diode array of the modification of Embodiment 1.

Subsequently, as is shown in FIG. 8A, with the red laser diode formation region 2 on the second current block formation layer 27A masked, chemical etching is carried out until the first current block layer 37 is exposed in the infrared laser diode formation region 1. Thereafter, the exposed first current block layer 37 and the second current block formation layer 27A are selectively chemically etched by respectively using the second p-type cladding layer 36 and the fifth p-type cladding formation layer 26A as etching stoppers. Thus, stripe-shaped openings 37a and 27a extending substantially in parallel to each other are simultaneously formed.

Figure 8B:
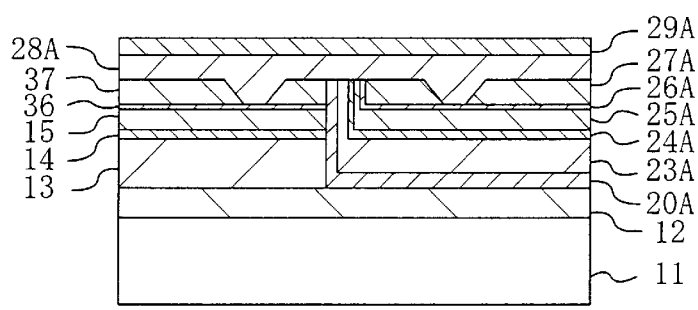

Next, as is shown in FIG. 8B, a sixth p-type cladding formation layer 28A of p-type $(Al_{0.6}Ga_{0.4})_{0.5}In_{0.5}P$ with a thickness of approximately 2.2 μm is grown on the entire surfaces of the first current block layer 37 and the second current block formation layer 27A by the MOVPE so as to fill the openings 37a and 27a. Subsequently, a second p-type contact formation layer 29A of p-type GaAs in a high concentration is grown on the sixth p-type cladding formation layer 28A.

Figure 8C:
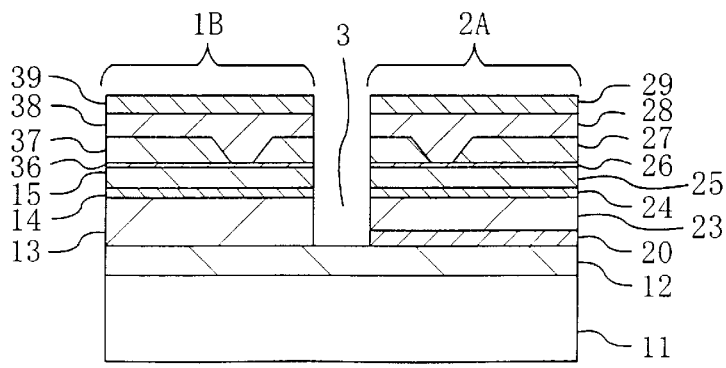

Then, as is shown in FIG. 8C, with the infrared laser diode formation region 1 and the red laser diode formation region 2 on the second p-type contact formation layer 29A masked, the height adjusting buffer formation layer 20A, the second n-type cladding formation layer 23A, the second active formation layer 24A, the fourth p-type cladding formation layer 25A, the fifth p-type cladding formation layer 26A, the second current block formation layer 27A, the sixth p-type cladding formation layer 28A and the second p-type contact formation layer 29A are chemically etched until the buffer layer 12 or the substrate 11 is exposed. Thus, a separation channel 3 is formed. In this manner, in the infrared laser diode formation region 1, a third p-type cladding layer 38 formed from the sixth p-type cladding formation layer 28A and a first p-type contact layer 39 formed from the second p-type contact formation layer 29A are formed on the first current block layer 37, resulting in completing an infrared semiconductor laser diode 1B. On the other hand, in the red laser diode formation region 2, a red semiconductor laser diode 2A having the same structure as that of Embodiment 1 is completed.

As described so far, the second p-type cladding layer 36 and the fifth p-type cladding layer 26 have the same composition and the first current block layer 37 and the second current block layer 27 have the same composition in this modification. Therefore, the third p-type cladding layer 38 and the sixth p-type cladding layer 28 can be formed from one and the same semiconductor layer, that is, the sixth p-type cladding formation layer 28A. Similarly, the first p-type contact layer 39 and the second p-type contact layer 29 can be formed from one and the same semiconductor layer, that is, the second p-type contact formation layer 29A. Thus, the number of crystal growth procedures can be reduced.

In addition, since the openings 37a and 27a of the current block layers 37 and 27 can be formed through one photolithography process, the accuracy in the positions of the luminescent points of the respective laser diodes 1B and 2A can be improved.

To the contrary to this modification, the compositions of the second p-type cladding layer 36, the first current block layer 37 and the third p-type cladding layer 38 of the infrared semiconductor laser diode 1B and the compositions of the fifth p-type cladding layer 26, the second current block layer 27 and the sixth p-type cladding layer 28 of the red semiconductor laser diode 2A may be both AlGaAs.

Embodiment 2

Embodiment 2 of the invention will now be described with reference to the accompanying drawings.

Figure 9:
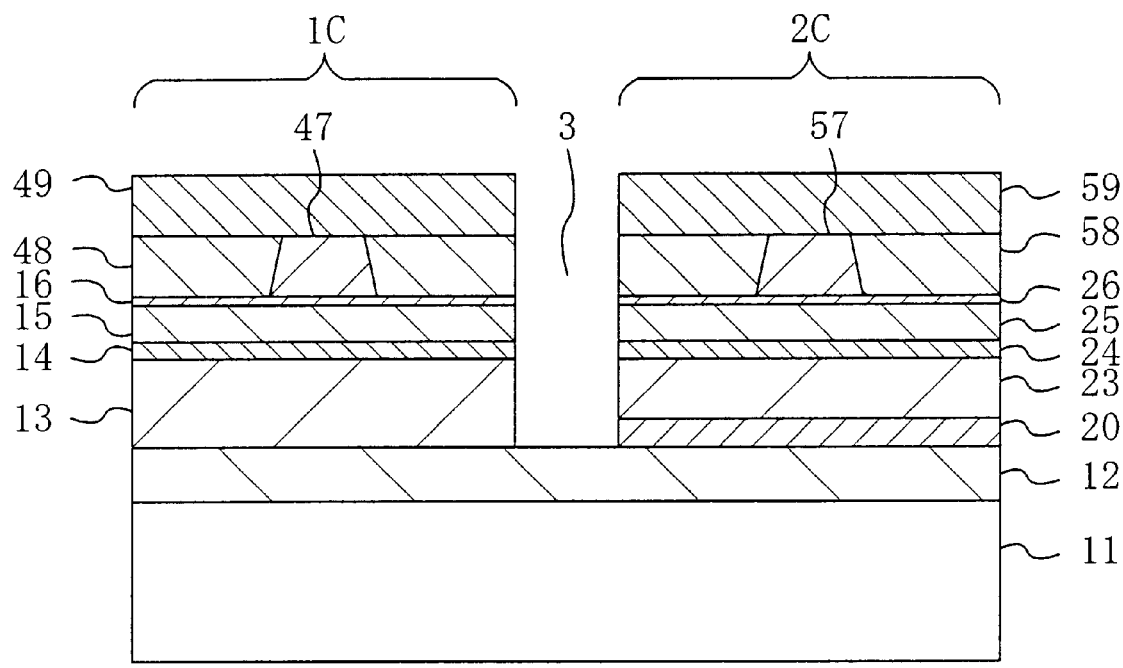
FIG. 9 is a cross-sectional view of a semiconductor laser diode array according to Embodiment 2 of the invention.

FIG. 9 shows the cross-sectional structure of a semiconductor laser diode array according to Embodiment 2. As is shown in FIG. 9, an infrared semiconductor laser diode 1C and a red semiconductor laser diode 2C separated from each other by a separation channel 3 are formed in a monolithic manner on a substrate 11 of n-type GaAs.

The infrared semiconductor laser diode 1C includes the following layers successively formed on the substrate 11: A buffer layer 12 of n-type GaAs; a first n-type cladding layer 13 of n-type $Al_xGa_{1-x}As$ (0<x≦1); a first active layer 14 of AlGaAs with a composition for lasing at a wavelength of 750 nm through 850 nm; a first p-type cladding layer 15 of p-type $Al_{x1}Ga_{1-x1}As$ (0<x1≦1); and a second p-type cladding layer 16 of p-type $Al_{x2}Ga_{1-x2}As$ (0≦x2≦1). The infrared semiconductor laser diode 1C further includes, on the second p-type cladding layer 16, a third p-type cladding layer 47 of p-type $Al_{x3}Ga_{1-x3}As$ (0<x3≦1) in the shape of a ridge extending in a vertical direction to the face of the drawing; a first current block layer 48 of n-type $Al_{y1}Ga_{1-y1}As$ (0<y1≦1) formed on the second p-type cladding layer 16 on both sides of the third p-type cladding layer 47 and having an energy gap larger than the energy of light emitted from the first active layer 14; and a first p-type contact layer 49 of p-type GaAs formed over the first current block layer 48 including the third p-type cladding layer 47 and in ohmic contact with a first p-side electrode (not shown) formed thereon.

The red semiconductor laser diode 2C includes the following layers successively formed on the buffer layer 12 and separated from the infrared semiconductor laser diode 1C by the separation channel 3: A height adjusting buffer layer 20 of n-type GaAs for improving the crystallinity of semiconductor layers grown on the substrate 11 having a thickness set for placing a second active layer described below at the same height from the substrate surface as the first active layer 14; a second n-type cladding layer 23 of n-type $(Al_zGa_{1-z})_{0.5}In_{0.5}P$ (0<z≦1); the second active layer 24 having a multiple quantum well structure of AlGaInP with a composition for lasing at a wavelength of 635 nm through 680 nm; a fourth p-type cladding layer 25 of p-type $(Al_{x4}Ga_{1-x4})_{0.5}In_{0.5}P$ (0<x4≦1); and a fifth p-type cladding layer 26 of p-type $(Al_{x5}Ga_{1-x5})_{0.5}In_{0.5}P$ (0≦x5≦1). The red semiconductor laser diode 2C further includes, on the fifth p-type cladding layer 26, a sixth p-type cladding layer 57 of p-type $(Al_{x6}Ga_{1-x6})_{0.5}In_{0.5}P$ (0<x6≦1) in the shape of a ridge extending substantially in parallel to the third p-type cladding layer 47; a second current block layer 58 of n-type $(Al_{y2}Ga_{1-y2})_{0.5}In_{0.5}P$ (0<y2≦1) formed on the fifth p-type cladding layer 26 on both sides of the sixth p-type cladding layer 57 and having an energy gap larger than the energy of light emitted from the second active layer 24; and a second p-type contact layer 59 of p-type GaAs formed over the second current block layer 58 including the sixth p-type cladding layer 57 and in ohmic contact with a second p-side electrode (not shown) formed thereon.

Also in Embodiment 2, a self-oscillation characteristic can be realized in the same manner as in Embodiment 1 by appropriately selecting structure parameters of the infrared semiconductor laser diode 1C and the red semiconductor laser diode 2C for realizing a difference Δn in the effective refractive index of $2 \times 10^{-3}$ through $5 \times 10^{-3}$.

Now, a method of fabricating the semiconductor laser diode array of this embodiment will be described with reference to the accompanying drawings.

Figure 10A:
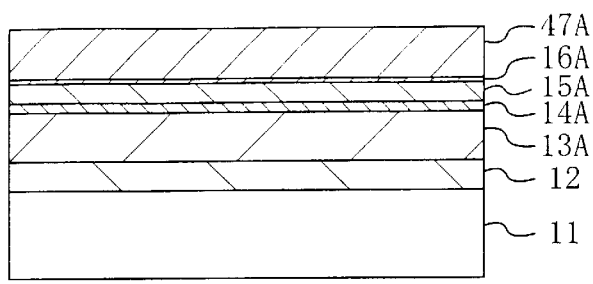
FIGS. 10A, 10B, 10C and 10D are cross-sectional views for showing procedures in a method of fabricating the semiconductor laser diode array of Embodiment 2.

FIGS. 10A through 10D and 11A through 11C are cross-sectional views for showing procedures in the method of fabricating the semiconductor laser diode array of Embodiment 2. First, as is shown in FIG. 10A, the following layers are successively grown on a substrate 11 of n-type GaAs by, for example, the MOVPE: A buffer layer 12 of n-type GaAs; a first n-type cladding formation layer 13A of n-type $Al_{0.5}Ga_{0.5}As$ with a thickness of approximately 1.5 μm; a first active formation layer 14A with a thickness of approximately 0.06 μm of AlGaAs having a composition for lasing at a wavelength of 750 nm through 850 nm; a first p-type cladding formation layer 15A of p-type $Al_{0.5}Ga_{0.5}As$ with a thickness of approximately 0.25 μm; a second p-type cladding formation layer 16A of p-type $Al_{0.2}Ga_{0.8}As$ with a thickness of approximately 0.01 μm; and a third p-type cladding formation layer 47A of p-type $Al_{0.6}Ga_{0.4}As$ with a thickness of approximately 2.2 μm.

Figure 10B:
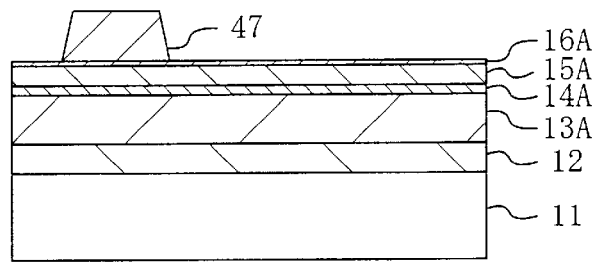

Next, as is shown in FIG. 10B, the third p-type cladding formation layer 47A is selectively chemically etched by using the second p-type cladding formation layer 16A as an etching stopper, thereby forming a third p-type cladding layer 47 in the shape of a ridge from the third p-type cladding formation layer 47A.

Figure 10C:
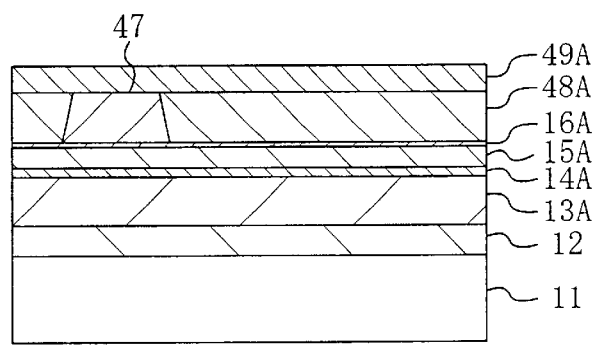

Then, as is shown in FIG. 10C, a first current block formation layer 48A of n-type $Al_{0.65}Ga_{0.35}As$ is selectively formed on the second p-type cladding formation layer 16A on both sides of the third p-type cladding layer 47. Thereafter, a first p-type contact formation layer 49A of p-type GaAs in a high concentration is grown over the first current block formation layer 48A including the third p-type cladding layer 47.

Figure 10D:
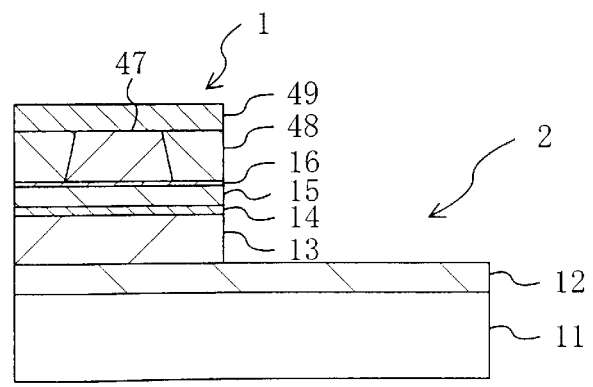

Subsequently, as is shown in FIG. 10D, with an infrared semiconductor laser diode formation region 1 on the first p-type contact formation layer 49A including the third p-type cladding layer 47 masked, the first n-type cladding formation layer 13A, the first active formation layer 14A, the first p-type cladding formation layer 15A, the second p-type cladding formation layer 16A, the first current block formation layer 48A and the first p-type contact formation layer 49A are chemically etched. Thus, a red semiconductor laser diode formation region 2 where the buffer layer 12 is exposed is formed on the substrate 11. In this manner, in the infrared semiconductor laser diode formation region 1, a first n-type cladding layer 13 is formed from the first n-type cladding formation layer 13A, a first active layer 14 is formed from the first active formation layer 14A, a first p-type cladding layer 15 is formed from the first p-type cladding formation layer 15A, a second p-type cladding layer 16 is formed from the second p-type cladding formation layer 16A, a first current block layer 48 is formed from the first current block formation layer 48A, and a first p-type contact layer 49 is formed from the first p-type contact formation layer 49A. At this point, the etching for forming the red semiconductor diode formation region 2 may be carried out so as to expose the surface of the substrate 11.

Figure 11A:
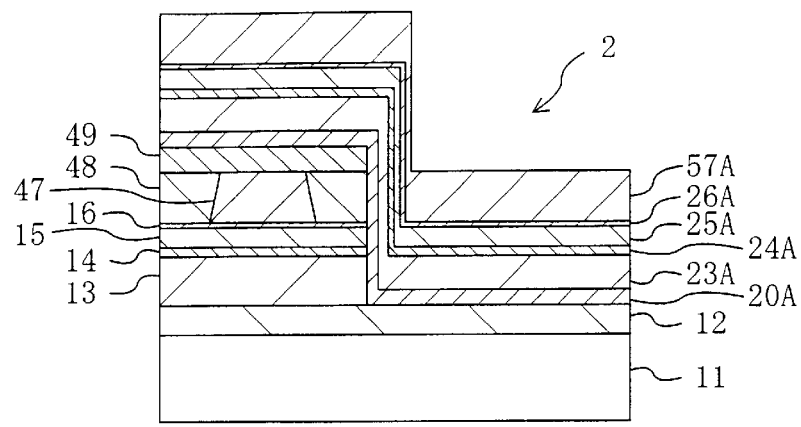
FIGS. 11A, 11B and 11C are cross-sectional views for showing other procedures in the method of fabricating the semiconductor laser diode array of Embodiment 2.

Next, as is shown in FIG. 11A, a height adjusting buffer formation layer 20A of n-type GaAs with a thickness of approximately 0.4 μm is grown on the entire surface of the substrate 11 including the red laser diode formation region 2 by the MOVPE. Subsequently, the following layers are successively grown on the height adjusting buffer formation layer 20A: A second n-type cladding formation layer 23A of n-type $(Al_{0.7}Ga_{0.3})_{0.5}In_{0.5}P$ with a thickness of approximately 1.1 μm; a second active formation layer 24A having a MQW structure of AlGaInP with a composition for lasing at a wavelength of 635 nm through 680 nm; a fourth p-type cladding formation layer 25A of p-type $(Al_{0.7}Ga_{0.3})_{0.5}In_{0.5}P$ with a thickness of approximately 0.25 μm; a fifth p-type cladding formation layer 26A of p-type $(Al_{0.1}Ga_{0.9})_{0.5}In_{0.5}P$ with a thickness of approximately 0.009 μm; and a sixth p-type cladding formation layer 57A of p-type $(Al_{0.6}Ga_{0.4})_{0.5}In_{0.5}P$ with a thickness of approximately 2.2 μm.

Figure 11B:
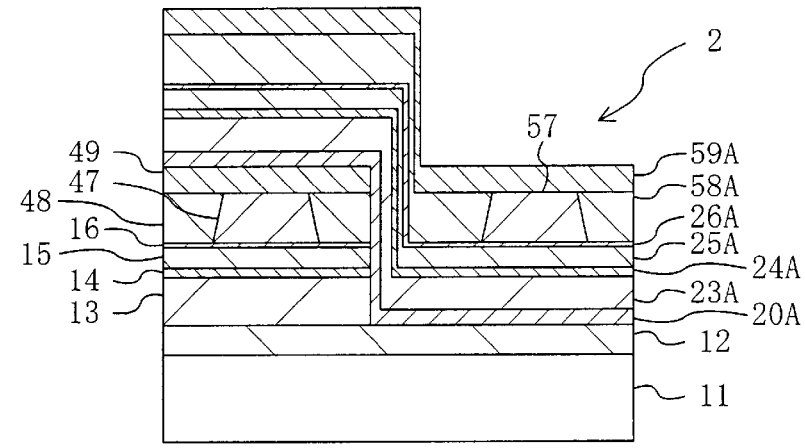
Figure 11C:
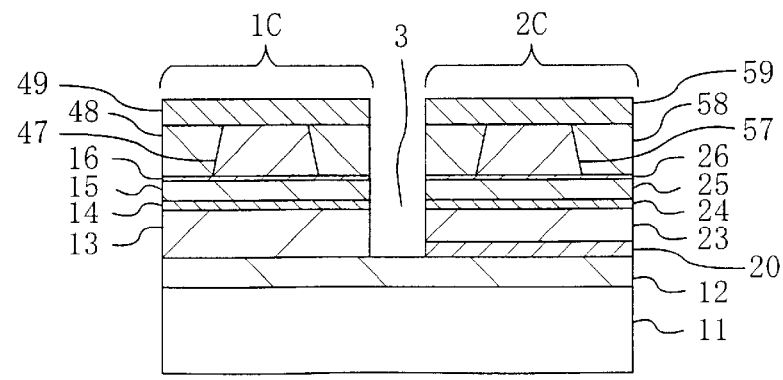

Then, as is shown in FIG. 11B, the sixth p-type cladding formation layer 57A in the red laser diode formation region 2 is selectively chemically etched by using the fifth p-type cladding formation layer 26A as an etching stopper, thereby forming, from the sixth p-type cladding formation layer 57A, a sixth p-type cladding layer 57 in the shape of a ridge extending substantially in parallel to the third p-type cladding layer 47. Thereafter, a second current block formation layer 58A of n-type $(Al_{0.5}Ga_{0.5})_{0.5}In_{0.5}P$ is selectively formed by the MOVPE on the fifth p-type cladding formation layer 26A on both sides of the sixth p-type cladding layer 57. Then, a second p-type contact formation layer 59A of p-type GaAs in a high concentration is grown over the second current block formation layer 58A including the sixth p-type cladding layer 57.

Subsequently, as is shown in FIG. 1C, with the infrared laser diode formation region 1 and the red laser diode formation region 2 masked, the height adjusting buffer formation layer 20A, the second n-type cladding formation layer 23A, the second active formation layer 24A, the fourth p-type cladding formation layer 25A, the fifth p-type cladding formation layer 26A, the second current block formation layer 58A and the second p-type contact formation layer 59A are chemically etched until the buffer layer 12 or the substrate 11 is exposed. Thus, a separation channel 3 is formed. In this manner, a red semiconductor laser diode 2C is formed in the red laser diode formation region 2. Accordingly, the red semiconductor laser diode 2C includes a height adjusting buffer layer 20 formed from the height adjusting buffer formation layer 20A; a second n-type cladding layer 23 formed from the second n-type cladding formation layer 23A; a second active layer 24 formed from the second active formation layer 24A; a fourth p-type cladding layer 25 formed from the fourth p-type cladding formation layer 25A; a fifth p-type cladding layer 26 formed from the fifth p-type cladding formation layer 26A; a second current block layer 58 formed from the second current block formation layer 58A; the sixth p-type cladding layer 57; and a second p-type contact layer 59 formed from the second p-type contact formation layer 59A.

The semiconductor laser diode array of Embodiment 1 has a structure in which an opening is formed in each current block layer, namely, a structure having the so-called inner stripe current channel. In contrast, in the semiconductor laser diode array of Embodiment 2, a current channel is provided by forming a ridge on a p-type cladding layer and forming a current block layer on both sides of the ridge.

Also in Embodiment 2, the energy gap of each current block layer is larger than the energy gap of the corresponding active layer. Furthermore, as is described in Embodiment 1, the self-oscillation characteristic can be realized by selecting the structure parameters of the infrared semiconductor laser diode 1C and the red semiconductor laser diode 2C so as to attain the difference Δn in the effective refractive index of $2 \times 10^{-3}$ through $5 \times 10^{-3}$.

Moreover, the red semiconductor laser diode 2C lasing at a shorter wavelength includes, between the buffer layer 12 and the second n-type cladding layer 23, the height adjusting buffer layer 20 for improving the crystallinity of the semiconductor layers of the red semiconductor laser diode 2C and adjusting the height from the substrate surface of the second active layer 24 to accord with the height of the first active layer 14 of the infrared semiconductor laser diode 1C. Accordingly, the accuracy in positions of the luminescent points of the respective laser diodes 1C and 2C can be easily and definitely improved.

Also, since the infrared semiconductor laser diode 1C is fabricated priorly to the red semiconductor laser diode 2C, zinc corresponding to a p-type dopant included in the p-type cladding layers 25, 26 and 57 of the red semiconductor laser diode 2C can be suppressed from diffusing into the second active layer 24.

Modification 1 of Embodiment 2

Modification 1 of Embodiment 2 will now be described with reference to the accompanying drawings.

Figure 12:
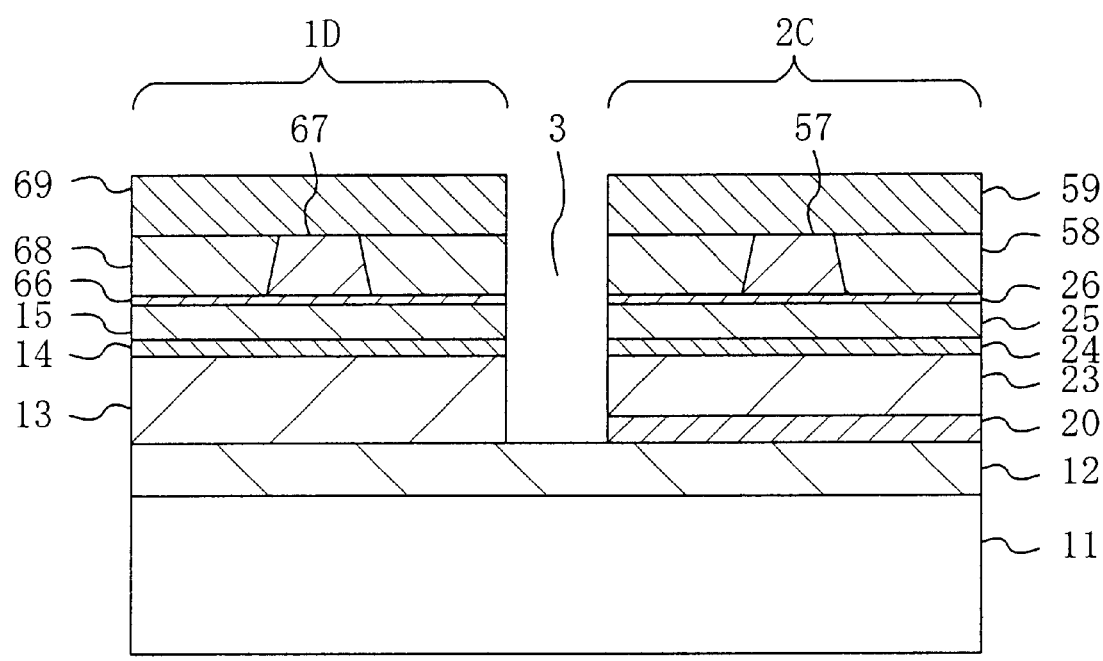
FIG. 12 is a cross-sectional view of a semiconductor laser diode array according to Modification 1 of Embodiment 2.

FIG. 12 shows the cross-sectional structure of a semiconductor laser diode array according to Modification 1 of Embodiment 2. In FIG. 12, like reference numerals are used to refer to like elements shown in FIG. 9 so as to omit the description. As is shown in FIG. 12, an infrared semiconductor laser diode 1D and a red semiconductor laser diode 2C separated from each other by a separation channel 3 is formed in a monolithic manner on a substrate 11 of GaAs.

The infrared semiconductor laser diode 1D of Modification 1 is different from the infrared semiconductor laser diode 1C of Embodiment 2 in a second p-type cladding layer 66 formed from p-type $(Al_{x5}Ga_{1-x5})_{0.5}In_{0.5}P$, a third p-type cladding layer 67 formed from p-type $(Al_{x6}Ga_{1-6})_{0.5}In_{0.5}P$, a first current block layer 68 formed from n-type $(Al_{y2}Ga_{1-y2})_{0.5}In_{0.5}P$, and a first p-type contact layer 69 formed from p-type GaAs. In other words, the second p-type cladding layer 66, the third p-type cladding layer 67, the first current block layer 68 and the first p-type contact layer 69 respectively have the same compositions as corresponding layers of the red semiconductor laser diode 2C, namely, a fifth cladding layer 26, a sixth p-type cladding layer 57, a second current block layer 58 and a second p-type contact layer 59.

When this structure is employed, the first current block layer 68 and the second current block layer 58 can be formed in one growth process and the first p-type contact layer 69 and the second p-type contact layer 59 can be formed in one growth process. As a result, the fabrication process can be simplified.

A method of fabricating the semiconductor laser diode array of this modification will now be described with reference to the accompanying drawings.

Figure 13A:
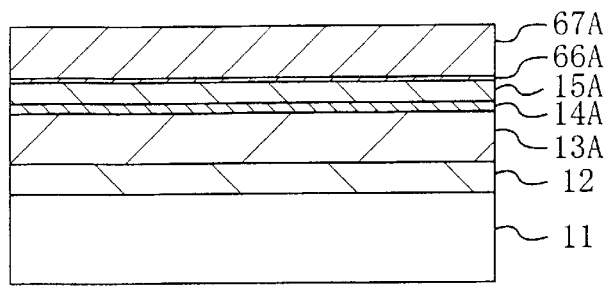
FIGS. 13A, 13B and 13C are cross-sectional views for showing procedures in a method of fabricating the semiconductor laser diode array of Modification 1 of Embodiment 2.

FIGS. 13A through 13C and 14A through 14C are cross-sectional views for showing procedures in the method of fabricating the semiconductor laser diode array of Modification 1 of Embodiment 2. First, as is shown in FIG. 13A, the following layers are successively grown on a substrate 11 of n-type GaAs by, for example, the metal organic vapor phase epitaxial growth (MOVPE): A buffer layer 12 of n-type GaAs; a first n-type cladding formation layer 13A of n-type $Al_{0.5}Ga_{0.5}As$ with a thickness of approximately 1.5 μm; a first active formation layer 14A of AlGaAs with a composition for lasing at a wavelength of 750 nm through 850 nm with a thickness of approximately 0.06 μm; a first p-type cladding formation layer 15A of p-type $Al_{0.5}Ga_{0.5}As$ with a thickness of approximately 0.25 μm; a second p-type cladding formation layer 66A of p-type $(Al_{0.5}Ga_{0.5})_{0.5}In_{0.5}P$ with a thickness of approximately 0.01 μm; and a third p-type cladding formation layer 67A of p-type $(Al_{0.6}Ga_{0.4})_{0.5}In_{0.5}P$ with a thickness of approximately 2.2 μm.

Figure 13B:
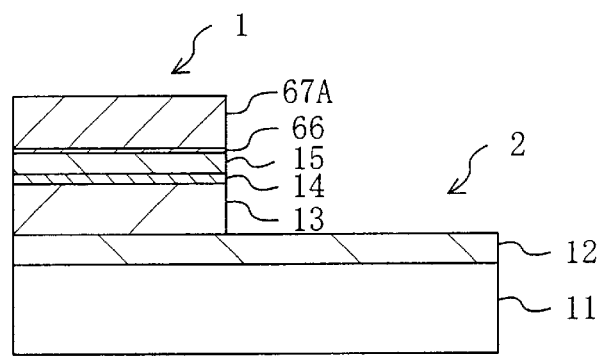

Next, as is shown in FIG. 13B, with an infrared laser diode formation region 1 on the third p-type cladding formation layer 67A masked, the first n-type cladding formation layer 13A, the first active formation layer 14A, the first p-type cladding formation layer 15A, the second p-type cladding formation layer 66A and the third p-type cladding formation layer 67A are chemically etched. Thus, a red laser diode formation region 2 where the buffer layer 12 is exposed is formed on the substrate 11. In this manner, in the infrared semiconductor laser diode formation region 1, a first n-type cladding layer 13 is formed from the first n-type cladding formation layer 13A, a first active layer 14 is formed from the first active formation layer 14A, a first p-type cladding layer 15 is formed from the first p-type cladding formation layer 15A, and a second p-type cladding layer 66 is formed from the second p-type cladding formation layer 66A. At this point, the etching for forming the red laser diode formation region 2 may be carried out so as to expose the surface of the substrate 11.

Figure 13C:
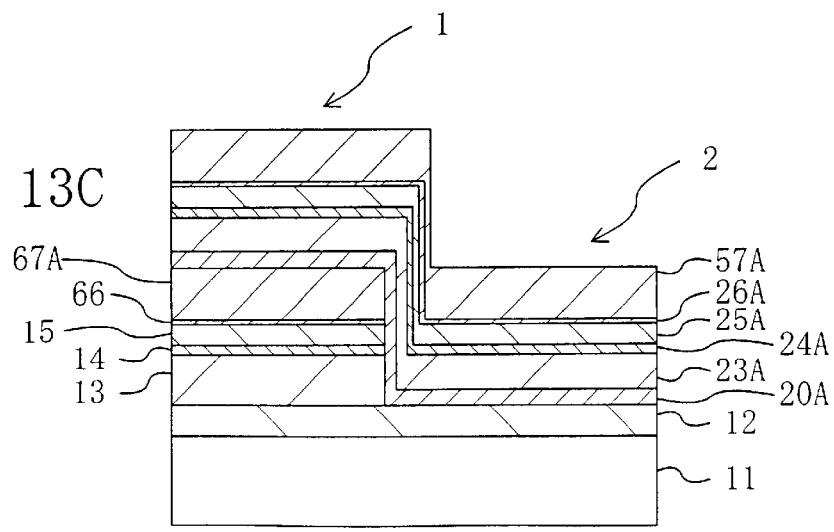

Then, as is shown in FIG. 13C, a height adjusting buffer formation layer 20A of n-type GaAs with a thickness of approximately 0.4 μm is grown on the entire surface of the substrate 11 including the red laser diode formation region 2 by the MOVPE. Thereafter, the following layers are successively grown on the height adjusting buffer formation layer 20A: A second n-type cladding formation layer 23A of n-type $(Al_{0.7}Ga_{0.3})_{0.5}In_{0.5}P$ with a thickness of approximately 1.1 μm; a second active formation layer 24A having a MQW structure of AlGaInP with a composition for lasing at a wavelength of 635 nm through 680 nm; a fourth p-type cladding formation layer 25A of p-type $(Al_{0.7}Ga_{0.3})_{0.5}In_{0.5}P$ with a thickness of approximately 0.25 μm; a fifth p-type cladding formation layer 26A of p-type $(Al_{0.1}Ga_{0.9})_{0.5}In_{0.5}P$ with a thickness of approximately 0.009 μm; and a sixth p-type cladding formation layer 57A of p-type $(Al_{0.6}Ga_{0.4})_{0.5}In_{0.5}P$ with a thickness of approximately 2.2 μm.

Figure 14A:
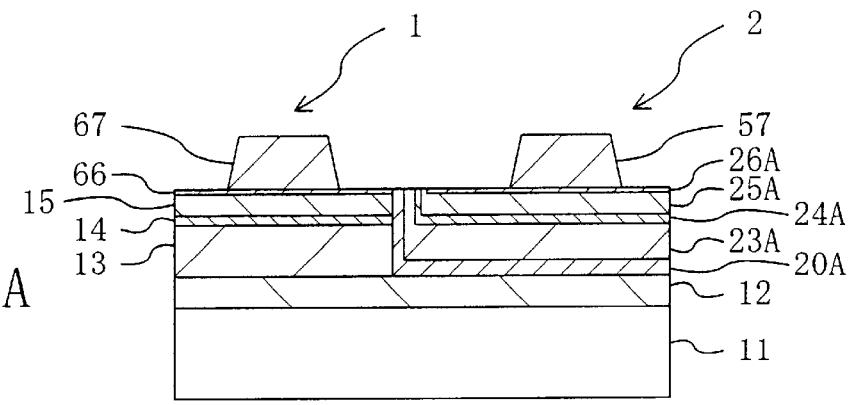
FIGS. 14A, 14B and 14C are cross-sectional views for showing other procedures in the method of fabricating the semiconductor laser diode array of Modification 1 of Embodiment 2.

Subsequently, as is shown in FIG. 14A, with the red laser diode formation region 2 on the sixth p-type cladding formation layer 57A masked, chemical etching is carried out until the third p-type cladding formation layer 67A is exposed in the infrared laser diode formation region 1. Thereafter, the exposed third p-type cladding formation layer 67A and the sixth p-type cladding formation layer 57A are selectively chemically etched by respectively using the second p-type cladding layer 66 and the fifth p-type cladding formation layer 26A as etching stoppers. Thus, a third p-type cladding layer 67 and a sixth p-type cladding formation layer 57 in the shape of ridges extending at an interval substantially in parallel to each other are simultaneously formed.

Figure 14B:
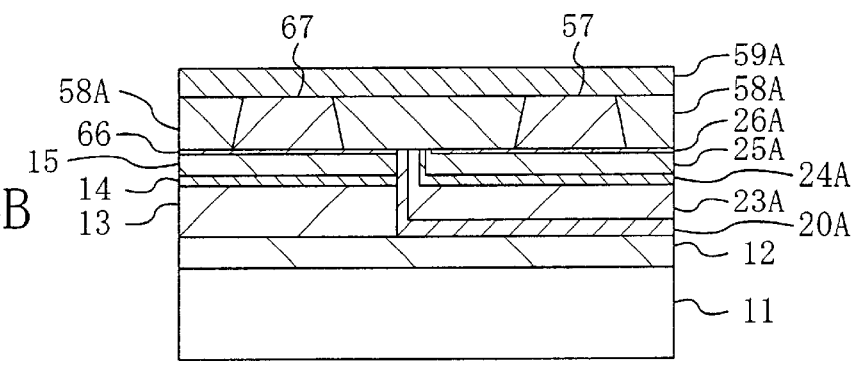

Next, as is shown in FIG. 14B, a second current block formation layer 58A of n-type $(Al_{0.5}Ga_{0.5})_{0.5}In_{0.5}P$ is grown so as to fill portions on the second p-type cladding layers 66 and the fifth p-type cladding formation layer 26A on both sides of the third p-type cladding layer 67 and the sixth p-type cladding layer 57. Thereafter, a second p-type contact formation layer 59A of p-type GaAs in a high concentration is grown over the second current block formation layer 58A including the third p-type cladding layer 67 and the sixth p-type cladding layer 57.

Figure 14C:
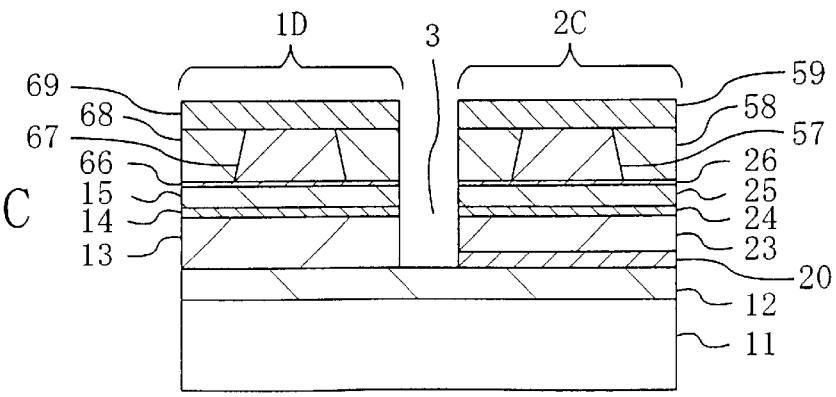

Then, as is shown in FIG. 14C, with the infrared laser diode formation region 1 and the red laser diode formation region 2 on the second p-type contact formation layer 59A masked, the height adjusting buffer formation layer 20A, the second n-type cladding formation layer 23A, the second active formation layer 24A, the fourth p-type cladding formation layer 25A, the fifth p-type cladding formation layer 26A, the second current block formation layer 58A and the second p-type contact formation layer 59A are chemically etched until the buffer layer 12 or the substrate 11 is exposed. Thus, a separation channel 3 is formed. In this manner, in the infrared laser diode formation region 1, a first current block layer 68 formed from the second current block formation layer 58A and a first p-type contact layer 69 formed from the second p-type contact formation layer 59A are formed on the second p-type cladding layer 66, resulting in completing an infrared semiconductor laser diode 1D. On the other hand, in the red laser diode formation region 2, a red semiconductor laser diode 2C having the same structure as that of Embodiment 2 is completed.

As described so far, the second p-type cladding layer 66 and the fifth p-type cladding layer 26 have the same composition and the third p-type cladding layer 67 and the sixth p-type cladding layer 57 have the same composition in this modification. Therefore, the first current block layer 68 and the second current block layer 58 can be formed from one and the same semiconductor layer, that is, the second current block formation layer 58A. Similarly, the first p-type contact layer 69 and the second p-type contact layer 59 can be formed from one and the same semiconductor layer, that is, the second p-type contact formation layer 59A. Thus, the number of crystal growth procedures can be reduced.

In addition, since the third p-type cladding layer 67 and the sixth p-type cladding layer 57 each in the shape of a ridge can be formed through one photolithography process, the accuracy in the positions of luminescent points of the respective laser diodes 1D and 2C can be improved.

To the contrary to Modification 1, the compositions of the second p-type cladding layer 66, the first current block layer 67 and the third p-type cladding layer 68 of the infrared semiconductor laser diode 1D and the compositions of the fifth p-type cladding layer 26, the second current block layer 58 and the sixth p-type cladding layer 57 of the red semiconductor laser diode 2C may be both AlGaAs.

Figure 15:
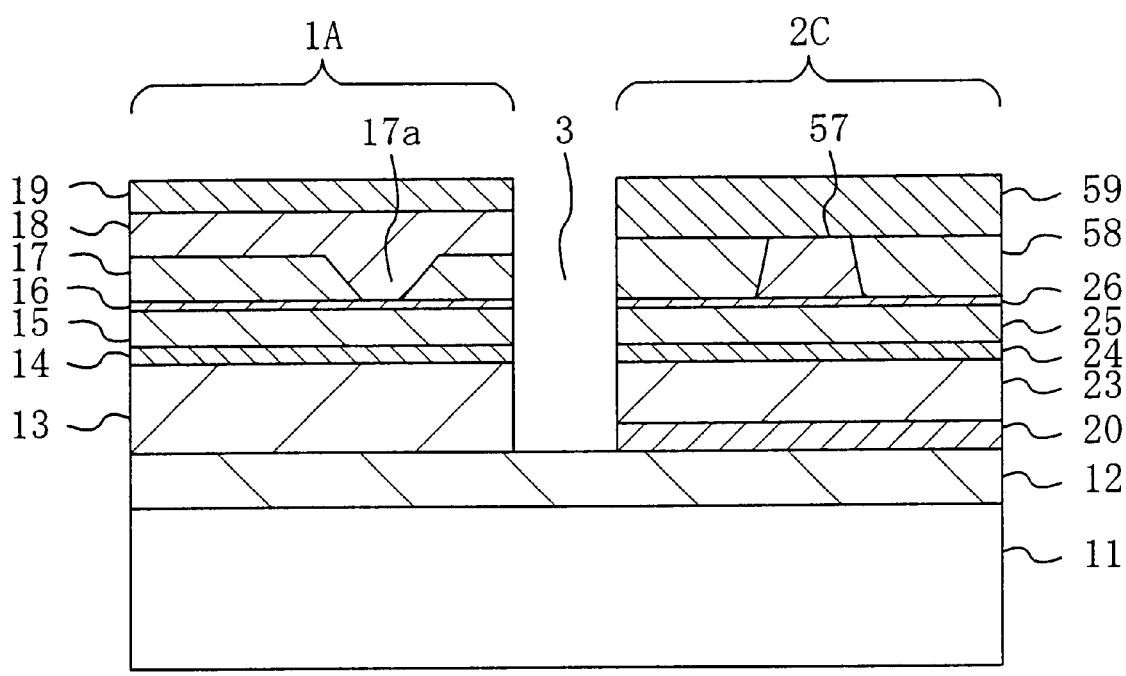
FIG. 15 is a cross-sectional view of a semiconductor laser diode array according to Modification 2 of Embodiment 2.

As Modification 1 of Embodiment 2, the infrared semiconductor laser diode 1A of Embodiment 1 and the red semiconductor laser diode 2C of Embodiment 2 separated from each other by the separation channel 3 may be formed in a monolithic manner as is shown in FIG. 15.

To the contrary to the structure shown in FIG. 15, a combination of the infrared semiconductor laser diode 1C of Embodiment 2 and the red semiconductor laser diode 2A of Embodiment 1 may be employed.

What is claimed is:

1. A semiconductor laser diode array comprising:
   a first laser diode including a first cladding layer formed on a substrate from a first semiconductor of a first conductivity type, a first active layer formed on said first cladding layer from a second semiconductor and a second cladding layer formed on said first active layer from a third semiconductor of a second conductivity type; and
   a second laser diode including a third cladding layer formed from a fourth semiconductor of the first conductivity type on said substrate with a space from said first laser diode, a second active layer formed on said third cladding layer from a fifth semiconductor having a larger energy gap than said first active layer and a fourth cladding layer formed on said second active layer from a sixth semiconductor of the second conductivity type,
   wherein said second laser diode further includes a height adjusting buffer layer formed between said substrate and said third cladding layer from a seventh semiconductor of the first conductivity type and having a thickness set for placing said second active layer at substantially the same height from a substrate surface as a height from the substrate surface of said first active layer, wherein the composition of the seventh semiconductor that forms the height adjusting buffer layer is different from the composition of the fourth semiconductor that forms the third cladding layer.

2. The semiconductor laser diode array of claim 1,
   wherein said first laser diode includes a first current block layer formed on said second cladding layer from an eighth semiconductor having a larger energy gap than said first active layer and including a stripe-shaped opening for selectively injecting carriers into said first active layer, and
   said second laser diode includes a second current block layer formed on said fourth cladding layer from a ninth semiconductor having a larger energy gap than said second active layer and including a stripe-shaped opening for selectively injecting carriers into said second active layer.

3. The semiconductor laser diode array of claim 2,
   wherein, in said first laser diode, a difference between an effective refractive index of a region of said first current block layer included in said opening along a vertical direction to the substrate surface and an effective refractive index of a region of said first current block layer excluding said opening along the vertical direction to the substrate surface is approximately $2 \times 10^{-3}$ through approximately $1 \times 10^{-2}$, and
   in said second laser diode, a difference between an effective refractive index of a region of said second current block layer included in said opening along the vertical direction to the substrate surface and an effective refractive index of a region of said second current block layer excluding said opening along the vertical direction to the substrate surface is approximately $2 \times 10^{-3}$ through approximately $1 \times 10^{-2}$.

4. The semiconductor laser diode array of claim 2,
wherein said first current block layer is of the first conductivity type and includes arsenic and said second current block layer is of the first conductivity type and includes phosphorus.

5. The semiconductor laser diode array of claim 2,
wherein said first current block layer and said second current block layer are of the first conductivity type and include phosphorus.

6. The semiconductor laser diode array of claim 2,
wherein said first current block layer and said second current block layer are of the first conductivity type and include arsenic.

7. The semiconductor laser diode array of claim 1,
wherein the first laser diode is a laser diode, in which the first, second and third semiconductors are, composed of AlGaInAs-based semiconductor materials, and which irradiates infrared, and wherein the second laser diode is a laser diode, in which the fourth, fifth and sixth semiconductors are composed of AlGaInP-based semiconductor materials and the seventh semiconductor that forms the height adjusting buffer layer is composed of $Al_xGa_{1-x}As$ (where $0 \leq x \leq 1$), and which irradiates red light.

8. A method of fabricating a semiconductor laser diode array comprising the steps of:

forming a first cladding layer on a substrate from a first semiconductor of a first conductivity type;

forming a first active layer on said first cladding layer from a second semiconductor;

forming a second cladding layer on said first active layer from a third semiconductor of a second conductivity type;

forming, on said second cladding layer, a first current block layer including a stripe-shaped opening from a fourth semiconductor minimally absorbing light emitted from said first active layer;

forming a third cladding layer from a fifth semiconductor of the second conductivity type over said first current block layer including said opening;

forming a first semiconductor laser diode including said first cladding layer, said first active layer, said second cladding layer, said first current block layer and said third cladding layer and forming a second laser diode formation region on said substrate by etching said first cladding layer, said first active layer, said second cladding layer, said first current block layer and said third cladding layer with an area on said third cladding layer including said opening of said first current block layer masked;

forming a height adjusting buffer layer on said second laser diode formation region from a sixth semiconductor of the first conductivity type;

forming a fourth cladding layer on said height adjusting buffer layer from a seventh semiconductor of the first conductivity type;

forming a second active layer on said fourth cladding layer from an eighth semiconductor having a larger energy gap than said first active layer;

forming a fifth cladding layer on said second active layer from a ninth semiconductor of the second conductivity type;

forming, on said fifth cladding layer, a second current block layer including a stripe-shaped opening extending along substantially the same direction as a longitudinal direction of said opening of said first current block layer from a tenth semiconductor minimally absorbing light emitted from said second active layer;

forming a sixth cladding layer from an eleventh semiconductor of the second conductivity type over said second current block layer including said opening; and forming a second semiconductor laser diode including said height adjusting buffer layer, said fourth cladding layer, said second active layer, said fifth cladding layer, said second current block layer and said sixth cladding layer by etching said height adjusting buffer layer, said fourth cladding layer, said second active layer, said fifth cladding layer and said second current block layer and said sixth cladding layer with an area on said sixth cladding layer including said opening of said second current block layer masked, wherein the composition of the sixth semiconductor that forms the height adjusting buffer layer is different from the composition of the seventh semiconductor that forms the fourth cladding layer.

9. The method of fabricating a semiconductor laser diode array of claim 8,
wherein a difference in a height from a substrate surface to a top surface between said third cladding layer and said sixth cladding layer is approximately ±1 μm or less.

10. The method of fabricating a semiconductor laser diode array of claim 8,
wherein the first laser diode is a laser diode, in which the first, second, third, fourth and fifth semiconductors are composed of AlGaInAs-based semiconductor materials, and which irradiates infrared, and wherein the second laser diode is a laser diode, in which the seventh, eighth, ninth, tenth and eleventh semiconductors are composed of AlGaInP-based semiconductor materials and the sixth semiconductor that forms the height adjusting buffer layer is composed of $Al_xGa_{1-x}As$ (where $0 \leq x \leq 1$), and which irradiates red light.

11. A method of fabricating a semiconductor laser diode array comprising the steps of:

forming a first cladding layer on a substrate from a 9 first semiconductor of a first conductivity type;

forming a first active layer on said first cladding layer from a second semiconductor;

forming a second cladding layer on said first active layer from a third semiconductor of a second conductivity type;

forming a first current block layer on said second cladding layer from a fourth semiconductor minimally absorbing light emitted from said first active layer;

forming one part of a first semiconductor laser diode and forming a second laser diode formation region on said substrate by etching said first cladding layer, said first active layer, said second cladding layer and said first current block layer with a first laser diode formation region on said first current block layer masked;

forming a height adjusting buffer layer on said second laser diode formation region from a fifth semiconductor of the first conductivity type;

forming a third cladding layer on said height adjusting buffer layer from a sixth semiconductor of the first conductivity type;

forming a second active layer on said third cladding layer from a seventh semiconductor having a larger energy gap than said first active layer;

forming a fourth cladding layer on said second active layer from an eighth semiconductor of the second conductivity type;

forming, on said fourth cladding layer, a second current block layer including a stripe-shaped opening from said fourth semiconductor minimally absorbing light emitted from said second active layer;

forming stripe-shaped openings extending at an interval in parallel to each other by etching said first current block layer and said second current block layer;

forming a ninth semiconductor layer of the second conductivity type over said first current block layer and said second current block layer including said openings; and forming the other part of said first semiconductor laser diode including a fifth cladding layer and forming a second semiconductor laser diode including said height adjusting buffer layer, said third cladding layer, said second active layer, said fourth cladding layer and a sixth cladding layer by forming said fifth cladding layer on said first current block layer from said ninth semiconductor layer and forming said sixth cladding layer on said second current block layer from said ninth semiconductor layer through etching of at least said ninth semiconductor layer with said first laser diode formation region and said second laser diode formation region on said ninth semiconductor layer masked, wherein the composition of the fifth semiconductor that forms the height adjusting buffer layer is different from the composition of the sixth semiconductor that forms the third cladding layer.

12. The method of fabricating a semiconductor laser diode array of claim 11, wherein a difference in a height from a substrate surface to a top surface between said fifth cladding layer and said sixth cladding layer is approximately ±1 μm or less.

13. The method of fabricating a semiconductor laser diode array of claim 11, wherein the first laser diode is a laser diode, in which the first, second, and third semiconductors are composed of AlGaInAs-based semiconductor materials, and which irradiate infrared, and wherein the second laser diode is a laser diode, in which the sixth, seventh, and eighth semiconductors are composed of AlGaInP-based semiconductor materials and the fifth semiconductor that forms the height adjusting buffer layer is composed of $Al_xGa_{1-x}As$ (where $0 \leq x \leq 1$), and which irradiates red light.

14. A method of fabricating a semiconductor laser diode array comprising the steps of:

forming a first cladding layer on a substrate from a first semiconductor of a first conductivity type;

forming a first active layer on said first cladding layer from a second semiconductor;

forming a second cladding layer on said first active layer from a third semiconductor of a second conductivity type;

forming a third cladding layer in the shape of a ridge on said second cladding layer from a fourth semiconductor of the second conductivity type;

forming, on said second cladding layer on both sides of said third cladding layer, a first current block layer from a fifth semiconductor minimally absorbing light emitted from said first active layer;

forming a first semiconductor laser diode including said first cladding layer, said first active layer, said second cladding layer, said third cladding layer and said first current block layer and forming a second laser diode formation region on said substrate by etching said first cladding layer, said first active layer, said second cladding layer and said first current block layer with an area on said first current block layer including said third cladding layer masked;

forming a height adjusting buffer layer on said second laser diode formation region from a sixth semiconductor of the first conductivity type;

forming a fourth cladding layer on said height adjusting buffer layer from a seventh semiconductor of the first conductivity type;

forming a second active layer on said fourth cladding layer from an eighth semiconductor having a larger energy gap than said first active layer.

forming a fifth cladding layer on said second active layer from a ninth semiconductor of the second conductivity type;

forming, on said fifth cladding layer, a sixth cladding layer in the shape of a ridge extending along substantially the same direction as a longitudinal direction of said third cladding layer from a tenth semiconductor of the second conductivity type;

forming, on said fifth cladding layer on both sides of said sixth cladding layer, a second current block layer from an eleventh semiconductor minimally absorbing light emitted from said second active layer; and forming a second semiconductor laser diode including said height adjusting buffer layer, said fourth cladding layer, said second active layer, said fifth cladding layer, said sixth cladding layer and said second current block layer by etching said height adjusting buffer layer, said fourth cladding layer, said second active layer, said fifth cladding layer and said second current block layer with an area on said second current block layer including said sixth cladding layer masked, wherein the composition of the sixth semiconductor that forms the height adjusting buffer layer is different from the composition of the seventh semiconductor that forms the fourth cladding layer.

15. The method of fabricating a semiconductor laser diode array of claim 14, wherein a difference in a height from a substrate surface to a top surface between said first current block layer and said second current block layer is approximately ±1 μm or less.

16. The method of fabricating a semiconductor laser diode array of claim 14, wherein the first laser diode is a laser diode, in which the first, second, third, fourth and fifth semiconductors are composed of AlGaInAs-based semiconductor materials, and which irradiates infrared, and wherein the second laser diode is a laser diode, in which the seventh, eighth, ninth, tenth and eleventh semiconductors are composed of AlGaInP-based semiconductor materials and the sixth semiconductor that forms the height adjusting buffer layer is composed of $Al_xGa_{1-x}As$ (where $0 \leq x \leq 1$), and which irradiates red light.

17. A method of fabricating a semiconductor laser diode array comprising the steps of:

forming a first cladding layer on a substrate from a first semiconductor of a first conductivity type;

forming a first active layer on said first cladding layer from a second semiconductor;

forming a second cladding layer on said first active layer from a third semiconductor of a second conductivity type;

forming a fourth semiconductor layer of the second conductivity type on said second cladding layer;

forming one part of a first semiconductor laser diode and forming a second laser diode formation region on said substrate by etching said first cladding layer, said first active layer, said second cladding layer and said fourth semiconductor layer with a first laser diode formation region on said fourth semiconductor layer masked;

forming a height adjusting buffer layer on said second laser diode formation region from a fifth semiconductor of the first conductivity type;

forming a third cladding layer on said height adjusting buffer layer from a sixth semiconductor of the first conductivity type;

forming a second active layer on said third cladding layer from a seventh semiconductor having a larger energy gap than said first active layer;

forming a fourth cladding layer on said second active layer from an eighth semiconductor of the second conductivity type;

forming a ninth semiconductor layer of the second conductivity type on said fourth cladding layer; forming a fifth cladding layer from said fourth semiconductor layer and a sixth cladding layer from said ninth semiconductor layer respectively in the shape of ridges extending at an interval in parallel to each other by etching said fourth semiconductor layer and said ninth semiconductor layer;

forming, on said second cladding layer on both sides of said fifth cladding layer and on said fourth cladding layer on both sides of said sixth cladding layer, a tenth semiconductor layer minimally absorbing light emitted from said first active layer and said second active layer; and forming the other part of said first semiconductor laser diode including a first current block layer and forming a second semiconductor laser diode including said height adjusting buffer layer, said third cladding layer, said second active layer, said fourth cladding layer, said sixth cladding layer and a second current block layer by forming said first current block layer on said second cladding layer from said tenth semiconductor layer and forming said second current block layer on said fourth cladding layer from said tenth semiconductor layer through etching of at least said tenth semiconductor layer with said first laser diode formation region and said second laser diode formation region on said tenth semiconductor layer masked, wherein the composition of the fifth semiconductor that forms the height adjusting buffer layer is different from the composition of the sixth semiconductor that forms the third cladding layer.

18. The method of fabricating a semiconductor laser diode array of claim 17, wherein a difference in a height from a substrate surface to a top surface between said first current block layer and said second current block layer is approximately ±1 µm or less.

19. The method of fabricating a semiconductor laser diode array of claim 17, wherein the first laser diode is a laser diode, in which the first, second, third and fourth semiconductors are composed of AlGaInAs-based semiconductor materials, and which irradiates infrared, and wherein the second laser diode is a laser diode, in which the sixth, seventh, eighth and ninth semiconductors are composed of AlGaInP-based semiconductor materials and the fifth semiconductor that forms the height adjusting buffer layer is composed of $Al_xGa_{1-x}As$ (where $0 \leq x \leq 1$), and which irradiates red light.

* * * * *

UNITED STATES PATENT AND TRADEMARK OFFICE
CERTIFICATE OF CORRECTION

PATENT NO.    : 6,546,035 B2
DATED         : April 8, 2003
INVENTOR(S)   : Osamu Imafuji and Masaaki Yuri It is certified that error appears in the above-identified patent and that said Letters Patent is hereby corrected as shown below:

<u>Column 26,</u>
Line 42, delete "9".

<u>Column 28,</u>
Line 18, change "." to -- ; --.

Signed and Sealed this

Ninth Day of September, 2003

JAMES E. ROGAN
*Director of the United States Patent and Trademark Office*